United States Patent
Kato et al.

(10) Patent No.: US 7,932,496 B2
(45) Date of Patent: Apr. 26, 2011

(54) INFRARED DETECTOR, INFRARED DETECTING APPARATUS, AND METHOD OF MANUFACTURING INFRARED DETECTOR

(75) Inventors: Masahiro Kato, Komaki (JP); Kazunori Masukawa, Komaki (JP); Yo Watanabe, Komaki (JP); Masahito Yamaguchi, Nagoya (JP); Koichi Tani, Nagoya (JP)

(73) Assignees: Mitsubishi Heavy Industries, Ltd., Tokyo (JP); National University Corporation Nagoya University, Aichi (JP)

( * ) Notice: Subject to any disclaimer, the term of this patent is extended or adjusted under 35 U.S.C. 154(b) by 102 days.

(21) Appl. No.: 12/320,564

(22) Filed: Jan. 29, 2009

(65) Prior Publication Data

US 2009/0272903 A1 Nov. 5, 2009

(30) Foreign Application Priority Data

Apr. 10, 2008 (JP) ................................ 2008-102003

(51) Int. Cl.
*G01J 5/20* (2006.01)
(52) U.S. Cl. ................................................... 250/338.4
(58) Field of Classification Search ..... 250/338.1–338.5
See application file for complete search history.

(56) References Cited

U.S. PATENT DOCUMENTS

| | | | |
|---|---|---|---|
| 5,510,627 A | 4/1996 | Snow | 257/21 |
| 5,567,955 A | 10/1996 | Liu | |
| 6,028,323 A * | 2/2000 | Liu | 257/21 |
| 7,079,307 B2 | 7/2006 | Chun-Liu et al. | 359/326 |
| 2003/0092212 A1 | 5/2003 | Buchanan et al. | |
| 2005/0083567 A1 | 4/2005 | Liu et al. | |

FOREIGN PATENT DOCUMENTS

| | | |
|---|---|---|
| GB | 2 300 486 | 11/1996 |
| JP | 02192769 | 7/1990 |
| JP | 2000-275692 | 10/2000 |
| JP | 2003-218366 | 7/2003 |

OTHER PUBLICATIONS

Liu et al., "Integrated quantum well intersub-band photodetector and light emitting diodes," May 1995, Electronic Letters, vol. 31. No. 10, pp. 832-833.*

(Continued)

*Primary Examiner* — David P Porta
*Assistant Examiner* — Kiho Kim
(74) *Attorney, Agent, or Firm* — Wenderoth, Lind & Ponack, L.L.P.

(57) ABSTRACT

An infrared detector comprises: a reflection portion transmitting far- and middle-infrared rays and reflecting near-infrared and visible rays; a photo-current generating portion having a quantum well structure in which electrons are excited by the far- and middle-infrared rays having passed through the reflection portion so as to generate photo-current; a light emitting portion having a quantum well structure into which electrons of the photo-current generated by the photo-current generating portion are injected and the electrons thus injected thereinto are recombined with holes, thus emitting near-infrared and visible rays; and a photo-detecting portion detecting the near-infrared and visible rays emitted from the light emitting portion, and detecting the near-infrared and visible rays emitted from the light emitting portion and reflected by the reflection portion. The reflection portion, the photo-current generating portion, and the light emitting portion are made of group III-V compound semiconductors layered on a semiconductor substrate.

18 Claims, 8 Drawing Sheets

OTHER PUBLICATIONS

Dupont et al., "Pixelless infrared imaging devices based on the integration of n-type quantum well infrared photodetector with near-infrared light emitting diode," 1999, SPIE Proceedings, vol. 3629, pp. 155-162.*

Partial European Search Report dated Apr. 12, 2010 in corresponding European Patent Application No. 09151754.0.

Shen Chiu and Al Scott: "QWIP-LED/CCD Coupling Study: Final Report" Defence Research Establishment Ottawa: Technical Report DREO TR 2000-101, Nov. 2000, pp. 1-47, XP002575385, Ottawa, Canada.

H.C. Liu et al., "Optoelectronic Integration of Quantum Well Intersubband Photodetectors for Two-Dimensional Array Fabrication", Institute for Microstructural Sciences, National Research Council, Ottawa, Ontario K1A 0R6, Canada, Apr. 1996, vol. 2694, pp. 148-156.

European Search Report dated Jul. 30, 2010 in corresponding European Application No. 09151754.0.

Shen Chiu et al., "Multi-Spectral QWIP-LED Devices: A Feasibility Study", Defence Research Establishment Ottawa: Technical Memorandum 1999-090, Oct. 1, 1999, pp. 1-25, XP002590486, Ottawa, Canada.

Gourley, P.L., et al., "Pseudomorphic InGaAs/GaAs/AlGaAs Mirrors for Optical Devices in the Near-Infrared 0.9-1.3 μm", Journal of Applied Physics, American Institute of Physics, New York, US, LNKD-DOI: 10.1063/1.342553, vol. 65, No. 1, Jan. 1, 1989, pp. 380-383, XP000065081.

Gebretsadik, H. et al., "Growth of High-Quality GaAs/AlAs Bragg Mirrors on Patterned InP-Based Quantum Well Mesa Structures", Applied Physics Letters, AIP, American Institute of Physics, Melville, NY, US LNKD-DOI: 10.1063/1.119800, vol. 71, No. 5, Aug. 4, 1997, pp. 581-583, XP000699618.

* cited by examiner

INFRARED DETECTOR, INFRARED DETECTING APPARATUS, AND METHOD OF MANUFACTURING INFRARED DETECTOR

BACKGROUND OF THE INVENTION

1. Field of the Invention

The present invention relates to an infrared detector to detect infrared rays, an infrared detecting apparatus, and a method of manufacturing an infrared detector.

2. Description of Related Art

Among the infrared detectors that have been put to practical use, those detecting infrared rays in the far-infrared wavelength range (for example, a wavelength band ranging from 8 µm to 12 µm) include: infrared detectors made of a semiconductor of HgCdTe, which is a group II-VI compound; and quantum well infrared photo-detectors (QWIPs) made of a superlattice of a group III-V compound semiconductor (GaAs/AlGaAs).

The infrared detectors made of HgCdTe can accomplish high quantum efficiency, but the low melting point and the high vapor pressure of Hg make the growth of a high-quality crystal difficult. Manufacturing of HgCdTe image sensors results in an especially poor yield. In addition, it is impossible to obtain a high-quality substrate (CdTe or the like) with a large area, and such unavailability makes it difficult to manufacture image sensors with a large number of pixels.

QWIPs detect the infrared rays by a photo-current caused by a transition of electrons, which is caused by the absorption of the infrared rays, between the discrete energy levels of the electrons in the quantum well. The formation of the quantum well is accomplished by a superlattice structure of AlGaAs and GaAs, so that the matured technique of GaAs crystal-growth process makes it possible to manufacture high-quality image sensors with a large area. The electrons, however, are quantized only one-dimensionally, that is, only in the stacking direction of the superlattice. Accordingly, such image sensors are not sensitive to incident infrared rays from a direction that is perpendicular to the plane, which results in extremely low quantum efficiency.

Various propositions have been made thus far to address the above-mentioned problem. For example, Japanese Unexamined Patent Application Publication No. Hei 2-192769 discloses a structure in which sloping faces are formed in the substrate and a quantum-well layer is formed on the sloping faces. Japanese Patent Application Publication No. 2003-218366 discloses a lateral-direction conduction structure with self-assembled quantum dots. Japanese Patent Application Publication No. 2000-275692 discloses a wavelength-conversion structure in which the electrons generated in the QWIP are recombined in a quantum-well layer to emit near-infrared rays with a higher energy level than those of the incident infrared rays. The QWIPs that have been proposed thus far have not achieved satisfactory final detection sensitivity yet.

Far-infrared wavelength-range observation in space requires detection of infrared rays of weak intensity with a wide viewing angle and high resolution. What is necessary for this purpose is a large-area (a large-pixel-number) image sensor made of a material with high quantum efficiency. It is difficult, however, to manufacture an image sensor that can satisfy the above-mentioned two requirements.

SUMMARY OF THE INVENTION

The present invention is made in view of the above-mentioned problem, and aims to provide an infrared detector which has high detection sensitivity and which can be made with a large area. The present invention also aims to provide an infrared detecting apparatus and a method of manufacturing an infrared detector which share the above-mentioned excellent features.

A first aspect of the present invention to accomplish the above-mentioned objects provides an infrared detector that includes a reflection portion, a photo-current generating portion, a light emitting portion, and a photo-detecting portion. The reflection portion transmits rays in the far-infrared range and in the middle-infrared range and reflects rays in the near-infrared range and in the visible range. The photo-current generating portion has a quantum well structure. In the quantum well structure, electrons are excited by the rays in the far-infrared range and in the middle-infrared range that have passed through the reflection portion, and the electrons thus excited generate photo-current. The light emitting portion has a quantum well structure. Electrons of the photo-current generated by the photo-current generating portion are injected into the quantum well structure, and the electrons thus injected into the quantum well structure are recombined with holes so as to emit rays in the near-infrared range and in the visible range. The photo-detecting portion detects the rays in the near-infrared range and in the visible range emitted from the light emitting portion, and detects the rays in the near-infrared range and in the visible range emitted from the light emitting portion and reflected by the reflection portion. In the infrared detector, at least the reflection portion, the photo-current generating portion, and the light emitting portion are made of group III-V compound semiconductors that are layered on top of a substrate. In addition, incident rays in the far-infrared range and in the middle-infrared range are detected by the detection, performed by the photo-detecting portion, of the rays in the near-infrared range and in the visible range emitted from the light emitting portion.

A second aspect of the present invention to accomplish the above-mentioned objects provides the infrared detector of the first aspect with the following additional characteristics. The reflection portion, the photo-current generating portion, and the light emitting portion together form a first element. The photo-detecting portion forms an independent second element. The first element and the second element are bonded together to form a single united body.

A third aspect of the present invention to accomplish the above-mentioned objects provides the infrared detector of the first aspect with the following additional characteristics. The reflection portion, the photo-current generating portion, the light emitting portion, the photo-detecting portion are all made of group III-V compound semiconductors, and are layered on the substrate made of a group III-V compound semiconductor so as to form a single united body.

A fourth aspect of the present invention to accomplish the above-mentioned objects provides the infrared detector of the first aspect with the following additional characteristics. The photo-detecting portion is made of an avalanche photo diode.

A fifth aspect of the present invention to accomplish the above-mentioned objects provides the infrared detector of the first aspect with the following additional characteristics. In the quantum well structure of the photo-current generating portion, a well layer that is designed to be a quantum well is sandwiched by barrier layers. A film thickness of a barrier layer which is included in the photo-current generating portion and which is adjacent to the light emitting portion is larger than a film thickness of each of the other barrier layers of the photo-current generation portion, and is smaller than an electron mean free path. A composition ratio of the barrier layer which is included in the photo-current generating portion and which is adjacent to the light emitting portion is gradually changed in the film-thickness direction so that a band gap is gradually narrowed down towards the light emitting portion.

A sixth aspect of the present invention to accomplish the above-mentioned objects provides the infrared detector of the fifth aspect with the following additional characteristics. In the quantum well structure of the light emitting portion, a well layer which is included in the light emitting portion and which is designed to be a quantum well is sandwiched by a barrier layer of the light emitting portion and the barrier layer which is included in the photo-current generating portion and which is adjacent to the light emitting portion.

A seventh aspect of the present invention to accomplish the above-mentioned objects provides the infrared detector of the first aspect with the following additional characteristics. The reflection portion has a structure in which two different kinds of layers are alternately formed so as to cause distributed Bragg reflection of the rays in the near-infrared range and in the visible range while each of the layers of one kind having a refractive index that is different from a refractive index of each of the layers of the other kind.

An eighth aspect of the present invention to accomplish the above-mentioned objects provides the infrared detector of the first aspect with the following additional characteristics. The infrared detector further includes a refraction layer formed on the incident-surface side of the infrared detector. The refraction layer refracts rays in the far-infrared range and in the middle-infrared range perpendicularly-incident into the incident surface so as to make the refracted rays enter obliquely the photo-current generating portion.

A ninth aspect of the present invention to accomplish the above-mentioned objects provides the infrared detector according to the first aspect with the following additional characteristics. The quantum well structure of the photo-current generating portion is configured so that the electrons are excited by infrared rays in a wavelength range from 4 μm to 4.5 μm, which includes the 4.257-μm absorption wavelength of carbon dioxide.

A tenth aspect of the present invention to accomplish the above-mentioned objects provides an infrared detecting apparatus including the infrared detector of the first aspect.

An eleventh aspect of the present invention to accomplish the above-mentioned objects provides a method of manufacturing an infrared detector with the following characteristics. The method includes a step of forming a layer of a light emitting portion on top of a substrate. The light emitting portion has a quantum well structure in which electrons and holes are recombined together so that rays in the near-infrared range and in the visible range are emitted. The method also includes a step of forming a layer of a photo-current generating portion on top of the light emitting portion. The photo-current generating portion has a quantum well structure in which electrons are excited by rays in the far-infrared range and in the middle-infrared range, and photo-current that is to be injected into the light emitting portion is generated by the excited electrons. In addition, the method includes a step of forming a layer of a reflection portion on top of the photo-current generating portion so as to form a first element. The reflection portion transmits rays in the far-infrared range and in the middle-infrared range incident into the photo-current generating portion and reflects rays in the near-infrared range and in the visible range emitted from the light emitting portion towards a photo-detecting portion. Moreover, the method includes a step of forming an independent second element with the photo-detecting portion. The photo-detecting portion detects the rays in near-infrared range and in the visible range emitted from the light emitting portion, and detects the rays in the near-infrared range and in the visible range emitted from the light emitting portion and reflected by the reflection portion. Furthermore, the method includes a step of bonding the first element and the second element to form a single united body. In the method, at least the reflection portion, the photo-current generating portion, the light emitting portion are made of group III-V compound semiconductors by the same crystal-growth method. Manufactured thereby is an infrared detector that detects the incident rays in the far-infrared range and in the middle-infrared range by making the photo-detecting portion detect the rays in the near-infrared range and in the visible range emitted from the light emitting portion.

A twelfth aspect of the present invention to accomplish the above-mentioned objects provides a method of manufacturing an infrared detector with the following characteristics. The method includes a step of forming a layer of a photo-detecting portion on top of a substrate made of a group III-V compound semiconductor. The photo-detecting portion detects rays in the near-infrared range and in the visible range. The method also includes a step of forming a layer of a light emitting portion on top of the photo-detecting portion. The light emitting portion has a quantum well structure. In the quantum well structure, electrons and holes are recombined together so that rays in the near-infrared range and in the visible range to be detected by the photo-detecting portion are emitted. In addition, the method includes a step of forming a layer of a photo-current generating portion on top of the light emitting portion. The photo-current generating portion has a quantum well structure in which electrons are excited by rays in the far-infrared range and in the middle-infrared range, and photo-current that is to be injected into the light emitting portion is generated by the excited electrons. Moreover, the method includes a step of forming a layer of a reflection portion on top of the photo-current generating portion. The reflection portion transmits rays in the far-infrared range and in the middle-infrared range incident into the photo-current generating portion and reflects rays in the near-infrared range and in the visible range that are emitted from the light emitting portion towards the photo-detecting portion. All of the reflection portion, the photo-current generating portion, the light emitting portion, and the photo-detecting portion are made of group III-V compound semiconductors by the same crystal-growth method so as to form a single united body. Manufactured thereby is an infrared detector that detects the incident rays in the far-infrared range and in the middle-infrared range by making the photo-detecting portion detect the rays in the near-infrared range and in the visible range emitted from the light emitting portion.

A thirteenth aspect of the present invention to accomplish the above-mentioned objects provides the method of manufacturing an infrared detector of the twelfth aspect with the following additional characteristics. An avalanche photo diode is formed as the photo-detecting portion.

A fourteenth aspect of the present invention to accomplish the above-mentioned objects provides the method of manufacturing an infrared detector of the twelfth aspect with the following characteristics. As the quantum well structure of the photo-current generating portion, a structure is formed by sandwiching a well layer that is designed to be a quantum well between barrier layers. A barrier layer which is included in the photo-current generating portion and which is adjacent to the light emitting portion is formed in a film thickness which is larger than the film thickness of each of the other barrier layers of the photo-current generation portion and which is smaller than an electron mean free path. The barrier layer which is included in the photo-current generating portion and which is adjacent to the light emitting portion is formed to have a composition ratio that is gradually changed in the film-thickness direction so that a band gap is gradually narrowed down towards the light emitting portion.

A fifteenth aspect of the present invention to accomplish the above-mentioned objects provides the method of manufacturing an infrared detector according to the fourteenth aspect with the following additional characteristics. As the quantum well structure of the light emitting portion, a structure is formed by sandwiching a well layer which is included in the light emitting portion and which is designed to be a quantum well between a barrier layer of the light emitting portion and the barrier layer which is included in the photo-current generating portion and which is adjacent to the light emitting portion.

A sixteenth aspect of the present invention to accomplish the above-mentioned objects provides the method of manufacturing an infrared detector of the twelfth aspect with the following characteristics. As the reflection portion, a structure is formed by alternately forming two different kinds of layers so as to cause distributed Bragg reflection of the rays in the near-infrared range and in the visible range. Each of the layers of one kind has a refractive index that is different from a refractive index of each of the layers of the other kind.

A seventeenth aspect of the present invention to accomplish the above-mentioned objects provides the method of manufacturing an infrared detector of the twelfth aspect with the following additional characteristics. The method further includes a step of forming a refraction layer on the incident-surface side of the infrared detector. The refraction layer refracts rays in the far-infrared range and in the middle-infrared range perpendicularly-incident into the incident surface so as to make the refracted rays enter obliquely the photo-current generating portion.

An eighteenth aspect of the present invention to accomplish the above-mentioned objects provides the method of manufacturing an infrared detector of the twelfth aspect with the following additional characteristics. The quantum well structure of the photo-current generating portion is formed so that the electrons are excited by infrared rays in a wavelength range from 4 µm to 4.5 µm, which includes the 4.257-µm absorption wavelength of carbon dioxide.

According to the first to the third aspects and according to the eleventh and the twelfth aspects of the present invention, photo-current is generated by the rays in the far-infrared range and in the middle-infrared range incident into the photo-current generating portion with what is known as a QWIP structure. The electrons of the photo-current thus generated are injected into the light emitting portion. The electrons thus injected and the holes are recombined so as to emit rays in the near-infrared range and in the visible range. The emitted rays in the near-infrared range and in the visible range are reflected by the reflection portion so as to be confined to the inside of the infrared detector. Then, the photo-detecting portion detects the emitted rays in the near-infrared range and in the visible range. Consequently, the infrared detector can achieve improvement in the detection sensitivity. In addition, the infrared detector is formed by forming the layers made of group III-V compound semiconductors on top of the substrate made of a group III-V compound semiconductor (for example, a GaAs substrate). Accordingly, an image sensor of a large area (a large number of pixels) can be obtained.

According to the third and the twelfth aspects of the present invention, all of the reflection portion, the photo-current generating portion, the light emitting portion, and the photo-detecting portion are layered on top of the substrate so as to form a single united body. Consequently, the photo-detecting portion can detect, without loss, the rays in the near-infrared range and in the visible range emitted by the light emitting portion, so that the detection sensitivity can further be improved.

According to the fourth and the thirteenth aspects of the present invention, an avalanche photo diode is used as the photo-detecting portion. Consequently, the photo-detecting portion can detect, with high sensitivity, the rays in the near-infrared range and in the visible range emitted by the light emitting portion, so that the detection sensitivity can further be improved.

According to the fifth and the fourteenth aspects of the present invention, the barrier layer which is included in the photo-current generating portion and which is adjacent to the light emitting portion is formed in a film thickness that is smaller than the electron mean free path. In addition, the composition ratio of the above-mentioned barrier layer is gradually changed in the film-thickness direction so that the band gap can be gradually narrowed down towards the light emitting portion. Consequently, the electrons can be injected into the light emitting portion efficiently without causing the scattering of the electrons, so that the light emitting portion can emit, with high efficiency, the rays in the near-infrared range and in the visible range. As a result, the detection sensitivity can further be improved.

According to the sixth and the fifteenth aspects of the present invention, the quantum well structure of the light emitting portion can be formed using the adjacent barrier layer of the photo-current generating portion. Consequently, a band gap to emit the rays in the near-infrared range and in the visible range can be formed with a simple structure.

According to the seventh and the sixteenth aspects of the present invention, the reflection portion has a structure to cause distributed Bragg reflection. Consequently, the rays in the near-infrared range and in the visible range emitted from the light emitting portion towards the reflection portion can be reflected, with high efficiency, so as to make the reflected rays enter the side of the photo-detecting portion. As a result, the detection sensitivity can further be improved.

According to the eighth and the seventeenth aspects of the present invention, the refraction layer to refract the incident rays is formed on the incident-surface side of the infrared detector. Consequently, the rays in the far-infrared range and in the middle-infrared range perpendicularly-incident into the incident surface can be made to enter obliquely the photo-current generating portion with a QWIP structure. As a result, the quantum efficiency of the photo-current generating portion can be improved, so that the detection sensitivity can further be improved.

According to the ninth and the eighteenth aspects of the present invention, the quantum well structure of the photo-current generating portion is formed so that the electrons are excited by the infrared rays with a wavelength range from 4 µm to 4.5 µm, which includes the 4.257-µm absorption wavelength of carbon dioxide. Consequently, carbon dioxide, which is the detection target, can be detected with high efficiency by precluding the influence of the other molecules.

According to the tenth aspect of the present invention, the use of the infrared detector of the first aspect allows the infrared detecting apparatus to have high detection sensitivity and a large area (a large number of pixels).

BRIEF DESCRIPTION OF THE DRAWINGS

FIG. 1A is a diagram describing, schematically, the configuration of the infrared detector. FIG. 1B is a diagram describing the structure of the infrared detector and its energy bands.

FIG. 4A is a diagram describing, schematically, the configuration of the infrared detector. FIG. 4B is a diagram describing the structure of the infrared detector and its energy bands.

DETAILED DESCRIPTION OF THE INVENTION

Detailed description will be given below of an infrared detector, an infrared detecting apparatus, and a method of manufacturing an infrared detector according to the present invention with reference to FIGS. 1A and 1B to 8. Note that the description of the present invention is based on a configuration in which GaAs, which is a group III-V compound semiconductor, is the basic composition of the substrate and that of the detector. The semiconductor composition of the substrate and that of the detector, however, can be selected appropriately in accordance with the wavelength to be detected (hereafter, also referred to as the detection-target wavelength).

For example, when the detection-target wavelength ranges from 3 µm to 10 µm, the detector may be formed with a GaAs-based material (for example, GaAs, AlGaAs, InGaAs with a low In composition) on a GaAs substrate. This is the case of the embodiments to be described below. When the detection-target wavelength is shifted to the long-wavelength side, the detector may be formed with a GaAs-based material (for example, GaAs, InGaAs, InAlAs) on an InP substrate. When the detection-target wavelength ranges from 2 µm to 10 µm, which is a little wider on the short-wavelength side than the above-mentioned case of the embodiments, the detector may be formed with a GaN-based material on a sapphire substrate, a Si substrate, a SiC substrate, or a GaN (gallium nitride) substrate.

Embodiment 1

Figure 1A:
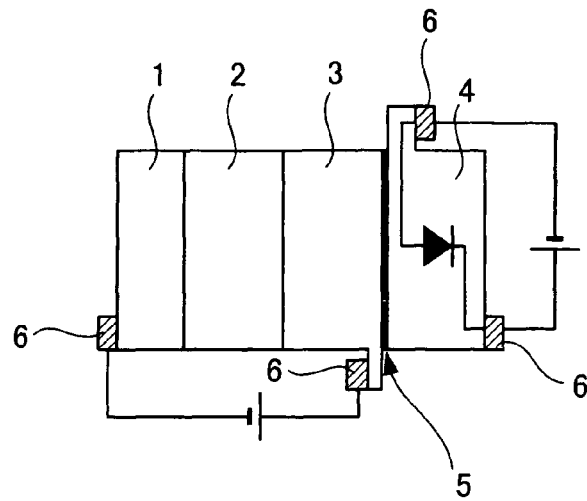
FIGS. 1A and 1B are diagrams describing an infrared detector according to a first embodiment of the present invention.
Figure 1B:
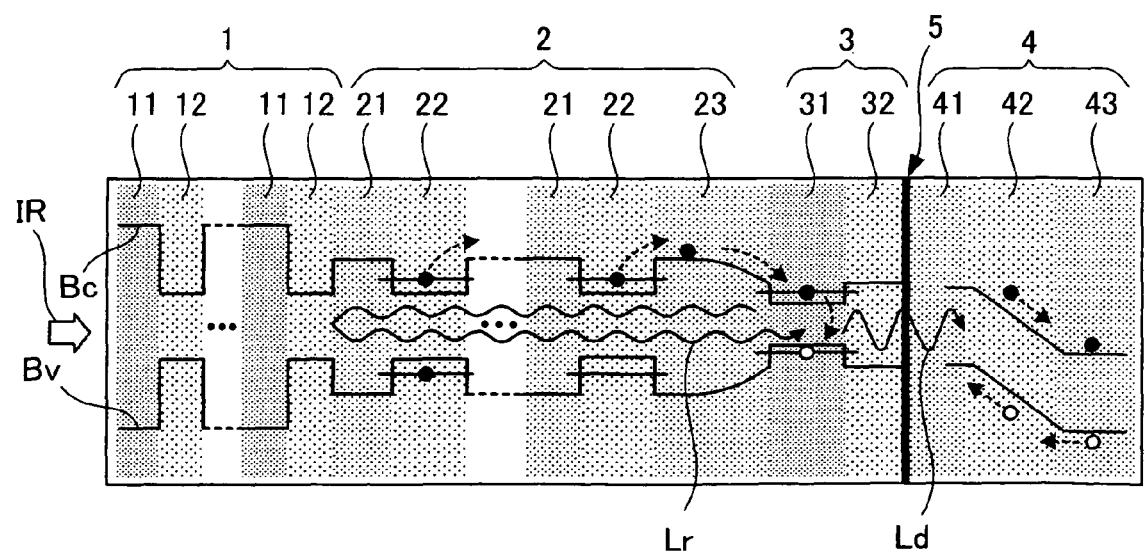
Figure 2A:
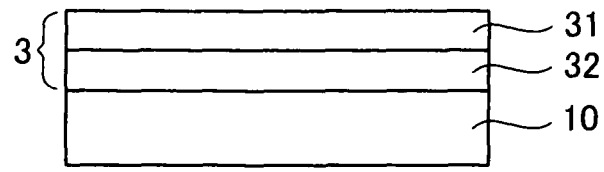
FIGS. 2A to 2C are diagrams describing a method of manufacturing the infrared detector illustrated in FIGS. 1A and 1B.
Figure 2B:
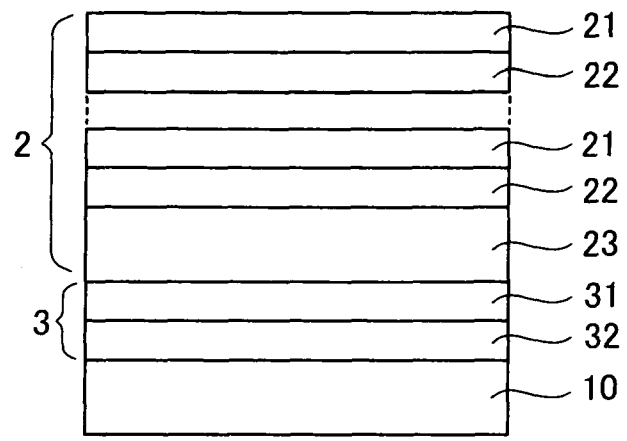
Figure 2C:
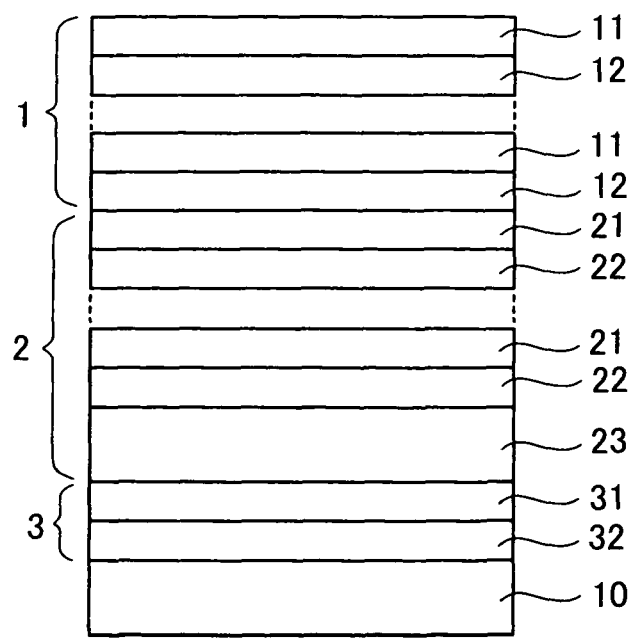

FIGS. 1A and 1B are diagrams describing an infrared detector according to a first embodiment of the present invention. FIG. 1A is a diagram describing, schematically, the configuration of the infrared detector. FIG. 1B is a diagram describing the structure of the infrared detector and the energy bands thereof. FIGS. 2A to 2C are diagrams describing a method of manufacturing the infrared detector.

As FIG. 1A illustrates, the infrared detector of Embodiment 1 includes a first element and a second element that are bonded together with a bonding portion 5 so as to form an integrated body. The first element includes a reflection portion 1, a photo-current generating portion 2, and a light emitting portion 3. The reflection portion 1 transmits rays in the far-infrared range and in the middle-infrared range, but reflects rays in the near-infrared range and in the visible range. The photo-current generating portion 2 has a multiple quantum well structure. In the multiple quantum well structure, the rays in the far-infrared range and in the middle-infrared range that have passed through the reflection portion 1 excite electrons, and the electrons thus excited generate a photo current. The light emitting portion 3 has a single quantum well structure. The electrons of the photo current thus generated in the photo-current generating portion 2 are injected into the single quantum well structure, and are recombined with the holes. Consequently, rays in the near-infrared range and in the visible range are emitted from the light emitting portion 3. The second element includes a photo-detecting portion 4. The photo-detecting portion 4 detects the rays in the near-infrared range and in the visible range thus emitted from the light emitting portion 3. Some of the rays in the near-infrared range and in the visible range that are emitted from the light emitting portion 3 are reflected by the reflection portion 1. These rays reflected by the reflection portion 1 are also detected by the photo-detecting portion 4.

Electrodes 6 are provided individually to the first element and to the second element, as well. The first element and the second element are driven independently of each other by the application of their respective predetermined voltages. Note that, although illustrated in none of FIGS. 1A to 1B and 2A to 2C, contact layers are provided to electrically connect each of the electrodes 6 to the corresponding one of the first and the second element.

In the infrared detector of Embodiment 1, at least the reflecting portion 1, the photo-current generating portion 2, and the light emitting portion 3 (i.e., the first element) are each made of a group III-V compound semiconductor (for example, a GaAs-based material). In the infrared detector, layers of the light emitting portion 3, the photo-current generating portion 2, and the reflecting portion 1 (i.e., the first element) are formed, in this order, on top of a substrate made of a group III-V compound semiconductor (for example, a GaAs substrate).

More specific element structure will be described with reference to FIG. 1B.

In the first element, the reflecting portion 1 includes first reflection layers 11 and second reflection layers 12. The refractive index of each first reflection layer 11 is different from that of each second reflection layer 12. The first element has a structure in which the plural first reflection layers 11 and the plural second reflection layers 12 are formed alternately and cyclically so that distributed Bragg reflection of the rays in the near-infrared range and in the visible range can be caused. As to the materials used for these layers, the first reflection layers 11 are made, for example, of AlAs while the second reflection layers 12 are made, for example, of GaAs.

The photo-current generating portion 2 includes barrier layers 21 and well layers 22. Each well layer 22 is designed to function as a quantum well. The multiple layers formed with the well layers 22 each of which is sandwiched by the barrier layers 21 form the multiple quantum well structure of the photo-current generating portion 2. The photo-current generating portion 2 has a structure equivalent to what is known as a QWIP, and has a superlattice structure with the barrier layers 21 made, for example, of AlGaAs and the well layers 22 made, for example, of GaAs. There are things that have to be noted concerning one of the barrier layers 21 adjacent to the light emitting portion 3 (hereafter, that barrier layer 21 will be referred to as a barrier layer 23). While the composition of the barrier layer 23 is basically the same as the composition of the other barrier layers 21, the proportion of each constituent of the barrier layer 23 is gradually changing in the film-thickness direction of the barrier layer 23 for the reasons to be described later. Consequently, the band gap is gradually narrowed towards the light emitting portion 3. In addition, the film thickness of the barrier layer 23 is larger than that of each barrier layer 21, but thinner than the electron mean free path.

The light emitting portion 3 includes a well layer 31 and a barrier layer 32. In the single quantum well structure of the light emitting portion 3, the well layer 31, which is designed to function as a quantum well, is sandwiched by the barrier layer 32 of the light emitting portion 3 and the adjacent barrier layer 23 of the photo-current generating portion 2 so as to form a band gap that is to emit rays in the near-infrared range and in the visible range. As to the materials used for these layers, the well layer 31 is made, for example, of InGaAs while the barrier layer 32 is made, for example, of GaAs. Alternatively, the barrier layer 32 may be made of AlGaAs. In addition, the barrier layer 32 may serve also as a contact layer that the electrode 6 is connected to.

In the second element, the photo-detecting portion 4 includes a p-type region layer 41, an intrinsic layer 42, and an n-type region layer 43. The intrinsic layer 42 is sandwiched by the p-type region layer 41 and the n-type region layer 43. Accordingly, the second element is a pin photodiode (hereafter, abbreviated as pinPD). The basic composition of the p-type region layer 41, of the intrinsic layer 42, and of the n-type region layer 43 is, for example, silicon (Si).

Note that the pinPD configuration described above is only an example of the second element. The pinPD may be replaced with a pn photodiode or an avalanche photodiode (hereafter, abbreviated as APD). In addition, the Si-based photodiode may be replaced with a GaAs-based photodiode.

The infrared detector of Embodiment 1 is configured to have the following detection target wavelength. The rays in the far-infrared range and in the middle-infrared range that excite the electrons in the photo-current generating portion 2 have a wavelength ranging from 3 μm to 10 μm. The rays in the near-infrared range and in the visible range that are emitted from the light emitting portion 3 and detected by the photo-detecting portion 4 have a wavelength ranging from 820 nm to 1000 nm.

Next, the operational principle of the infrared detector of Embodiment 1 will be described with reference to the energy bands that FIG. 1B illustrates. In FIG. 1B, Bc represents the conduction band, and Bv represents the valence band. Rays in the far-infrared range and in the middle-infrared range, which are denoted by IR, enter the infrared detector from the left-hand side of the drawing.

As FIG. 1B illustrates, quantum wells are formed in the photo-current generating portion 2 by sandwiching each well layer 22 between the adjacent barrier layers 21, and the electrons (represented by black circles in the drawing) exist in the quantum wells and at the energy level of the conduction-band side (Bc side). These electrons are excited by absorbing the incident rays in the far-infrared range and in the middle-infrared range. The electrons transfer among the multiple quantum wells, and are eventually injected into the well layer 31 of the light emitting portion 3 via the barrier layer 23 (see, the arrowed dot-lines). Here, the electrons having been generated in the photo-current generating portion 2 can be efficiently injected into the well layer 31 of the light emitting portion 3 without scatter by setting appropriately the composition and the film thickness of the barrier layer 23 (detailed description for the settings will be given later).

As FIG. 1B illustrates, a quantum well is formed in the light emitting portion 3, as well, by sandwiching the well layer 31 between the barrier layer 23 and the barrier layer 32. In the well layer 31, holes (represented by the white circle in the drawing) exist at the energy level of the valence-band side (Bv side). The holes and the electrons injected into the well layer 31 are recombined in the well layer 31, so that rays in the near-infrared range and in the visible range, which have larger energy, can be emitted.

The rays in the near-infrared range and in the visible range are emitted mainly in the stacking direction of the layers of the infrared detector of Embodiment 1 (the horizontal direction in the drawing). The rays in the near-infrared range and in the visible range emitted to the side of the photo-detecting portion 4 (such rays are represented by Ld in the drawing) enter directly the photo-detecting portion 4, and the intensity of the rays Ld is measured by the photo-detecting portion 4. On the other hand, the rays in the near-infrared range and in the visible range emitted to the side of the reflection portion 1 (such rays are represented by Lr in the drawing) are reflected with high efficiency by the distributed Bragg reflection that occurs in the reflection portion 1, and then enter the photo-detecting portion 4. The intensity of the rays thus entering the photo-detecting portion 4 is measured by the photo-detecting portion 4. As a consequence, the rays in the near-infrared range and in the visible range emitted from the light emitting portion 3 can be detected by the photo-detecting portion 4 with high efficiency.

Once the rays in the near-infrared range and in the visible range enter the photo-detecting portion 4, the rays then pass through the p-type region layer 41. After that, most of the rays that have passed through the p-type region layer 41 are absorbed in the intrinsic layer 42, so that electron-hole pairs are formed. These carriers (i.e., the electrons and the holes) drift and flow into the p-type region layer 41 and into the n-type region layer 43, so that the photo-current is generated. In summary, the rays in the far-infrared range and in the middle-infrared range incident into the infrared detector can be efficiently detected by detecting, with the photo-detecting portion 4, the rays in the near-infrared range and in the visible range emitted from the light emitting portion 3. Note that, normally, the photo-detecting portion 4 is reversely biased for the purpose of fast response.

As has been described above, the infrared detector of Embodiment 1 has a wavelength-conversion function to convert the rays in the far-infrared range and in the middle-infrared range that have entered the infrared detector into the rays in the near-infrared range and in the visible range that have larger energy than the rays in the far-infrared range and in the middle-infrared range. The wavelength conversion is accomplished by making the light emitting portion 3 emit the rays in the near-infrared range and in the visible range. To this end, the electrons generated in the photo-current generating portion 2 by the incident rays in the far-infrared range and in the middle-infrared range are recombined with the holes in the light emitting portion 3. Besides the wavelength-conversion function, the infrared detector of Embodiment 1 has an optical confinement function to confine the rays that have been converted into the rays in near-infrared range and in the visible range to the inside of the infrared detector. To this end, the reflection portion 1 reflects the rays in the near-infrared range and in the visible range that have been emitted from the light emitting portion 3. In summary, the infrared detector of Embodiment 1 is formed as a united body by combining together the photo-current generating portion 2 that has a QWIP structure, the light emitting portion 3 that has the wavelength-conversion function, and the reflection portion 1 that has the optical confinement function. The rays in the near-infrared range and in the visible range that have been subjected to the wavelength conversion are confined to the inside of the single infrared detector, and detected by the same single infrared detector. For this reason, in comparison to the ordinary QWIP-type infrared detectors, the infrared detector of Embodiment 1 can accomplish an improvement in the detection efficiency (i.e., an improved S/N ratio).

Note that the photo-current generating portion 2 and the light emitting portion 3 described above in Embodiment 1 are n-type devices that employ electrons as the carriers. Alternatively, the photo-current generating portion 2 and the light emitting portion 3 may be p-type devices that employ holes as the carriers. Although the operational principle of this case is the same as in the above-described case of Embodiment 1 with electrons as the carriers, there are differences between these cases in the barrier heights of the conductive band and of the valence band as well as in the effective mass. Accordingly, the photo-current generating portion 2 and the light emitting portion 3 of the case with holes as the carriers have to be configured appropriately by taking these differences into account.

Next, a method of manufacturing an infrared detector according to Embodiment 1 will be described with reference to FIGS. 2A to 2C. Note that the pinPD of the second element is formed independently of the first element by a manufacturing method that has been publicly known. For this reason, the description of the method of manufacturing the pinPD will not be given below.

1. Preparation Step

To begin with, a GaAs substrate 10 is subjected to an ultrasonic cleaning process using an organic alkali solvent, such as Semicoclean (trade name), and is then subjected to another ultrasonic cleaning process using ultrapure water. After the cleaning processes, the GaAs substrate 10 is brought into a pre-bake chamber, and is pre-baked (approximately at 200° C.) under an ultrahigh vacuum condition (approximately, at a pressure ranging from $1 \times 10^{-7}$ torr to $1 \times 10^{-10}$ torr) so as to remove the moisture.

In the meanwhile, Ga, Al, As, and In are heated to a high temperature in a molecular beam epitaxy (MBE) chamber, and the molecular beam pressure of each substance is measured. Then, the growth rates of GaAs, AlAs, AlGaAs, and InGaAs are measured by opening the molecular beam cell shutters when necessary. For example, when the growth rate of GaAs is measured, the As cell shutter, and the Ga cell shutter are opened so as to allow GaAs to grow.

While the As pressure is set at around $1 \times 10^{-5}$ torr, the GaAs substrate 10 from which the moisture has been removed is brought into the MBE chamber. The GaAs substrate 10 is then heated up to 580° C. In this event, while the temperature is 300° C. or higher, the As cell shutter is opened to avoid the separation of As.

2. Growth Step

The barrier layer 32 made of GaAs is formed on top of the GaAs substrate 10 by the MBE method, and then the well layer 31 made of InGaAs is formed on top of the barrier layer 32 by the same method. Thus formed is the light emitting portion 3 (see FIG. 2A). During these series of processes, the growth time is determined on the basis of each growth rate calculated beforehand so that each layer can have a designed film thickness. In accordance with the growth time thus determined, a control to open and close the cell shutters is carried out. Once the growth of the barrier layer 32 made of GaAs has been finished, a growth-interruption time (migration time) of approximately 30 seconds is secured so as to obtain a flat interface. The well layer 31 has to be lower than the band gap of the barrier layer 32, so that the In composition is increased as much as possible. However, there are some things that have to be noted as to the increasing of the In composition. As the In composition increases, the layer (flat plane) becomes thinner and thinner. For example, with the In composition of 0.2, the well layer 31 has a thickness of 4.2 nm or smaller. With the well layer 31 of 4.2-nm or larger thickness, a quantum dot is produced. With the In composition of 0.3, the well layer 31 has a thickness of 1.7 nm or smaller. When the well layer 31 is too thin, the light-emitting efficiency is impaired. For this reason, the well layer 31 preferably has a 1-nm thickness, at least. Accordingly, in accordance with the In composition, the film thickness of the well layer is set at an appropriate range.

Subsequently, the barrier layer 23 made of AlGaAs is formed on top of the light emitting portion 3 by the MBE method as in the case of the formation of the barrier layer 32 and the well layer 31. Also by the MBE method, the plural well layers 22 made of GaAs and the plural barrier layers 21 made of AlGaAs are alternately formed on top of the barrier layer 23. Thus formed is the photo-current generating portion 2 (see FIG. 2B). During these series of processes, the growth time is determined on the basis of each growth rate calculated beforehand so that each layer can have a designed film thickness. In accordance with the growth time thus determined, a control to open and close the cell shutters is carried out. Every time the growth of each of the barrier layers 21 and 23 made of AlGaAs or the growth of each of the well layers 22 made of GaAs has been finished, a growth-interruption time of approximately 30 seconds is secured so as to obtain a flat interface. In addition, the number of layers of the barrier layers 21 and of the well layers 21 is determined normally so that the formation of the pair of one barrier layer 21 and one well layer 21 may be repeated 50 to 100 times.

Each of the barrier layers 21 has a 25-nm thickness, at least. Such a thickness is large enough to prevent the electrons confined in each well layer 22 from reacting with the electrons of the well layers 22 located next to the barrier layers 21 that are adjacent to that well layer 22. Normally, the thickness of each barrier layer 21 is set at 25 nm to 50 nm. On the other hand, the composition and the film thickness of each of the well layers 22 have to be changed in accordance with the range of the detection-target wavelength. Normally, the thickness of each well layer 22 is several nanometers. In Embodiment 1, the composition ratio is 0.6, and the film thickness is 3 nm.

While the composition of the barrier layer 23 is basically the same as the other barrier layers 21, the proportion of Al is gradually reduced towards the light emitting portion 3. In addition, the film thickness of the barrier layer 23 is larger than each of the barrier layers 21. This is because it is preferable for the barrier layer 23 to inject the electrons generated in the photo-current generating portion 2 into the well layer 31 of the light emitting portion 3 efficiently without causing the scattering of the electrons. When, for example, the barrier layer 23 has the same composition as that of each barrier layer 21, the entire potential difference caused by the electrical field applied to the barrier layer 23 becomes the barrier. For this reason, in order to make the barrier (potential difference) as low as possible, the Al composition of the barrier layer 23 is gradually reduced towards the light emitting portion 3. Accordingly, the growth of the barrier layer 23 is carried out by a method which is based on the growth method of the barrier layers 21 but in which the Al composition is gradually reduced by closing, gradually, the Al cell shutter.

The film thickness of the barrier layer 23 is smaller than the electron mean free path (the distance that the electrons can travel without being scattered) so as to cause the least possible scattering of the electrons. Suppose a case, for example, where the bulk GaAs mobility (77 K, $1\times10^{16}$ cm$^{-3}$) $\mu$=20000 cm$^2$/Vs, the GaAs electron effective mass m*=0.067 m$_o$=0.067×9.1×10$^{-31}$, the collisional relaxation time $\tau$=$\mu$m*/e=0.76 ps, the electron velocity (high electrical field) v=1.0× 10$^7$ cm/s. In this case, the electron mean free path L=v×$\tau$=76 nm. Accordingly, the film thickness of the barrier layer 23 is 76 nm or smaller. In addition, since each barrier layer 21 has a thickness of 25 nm or larger, the barrier layer 23 is designed to have a thickness of 50 nm or larger.

Figure 3:
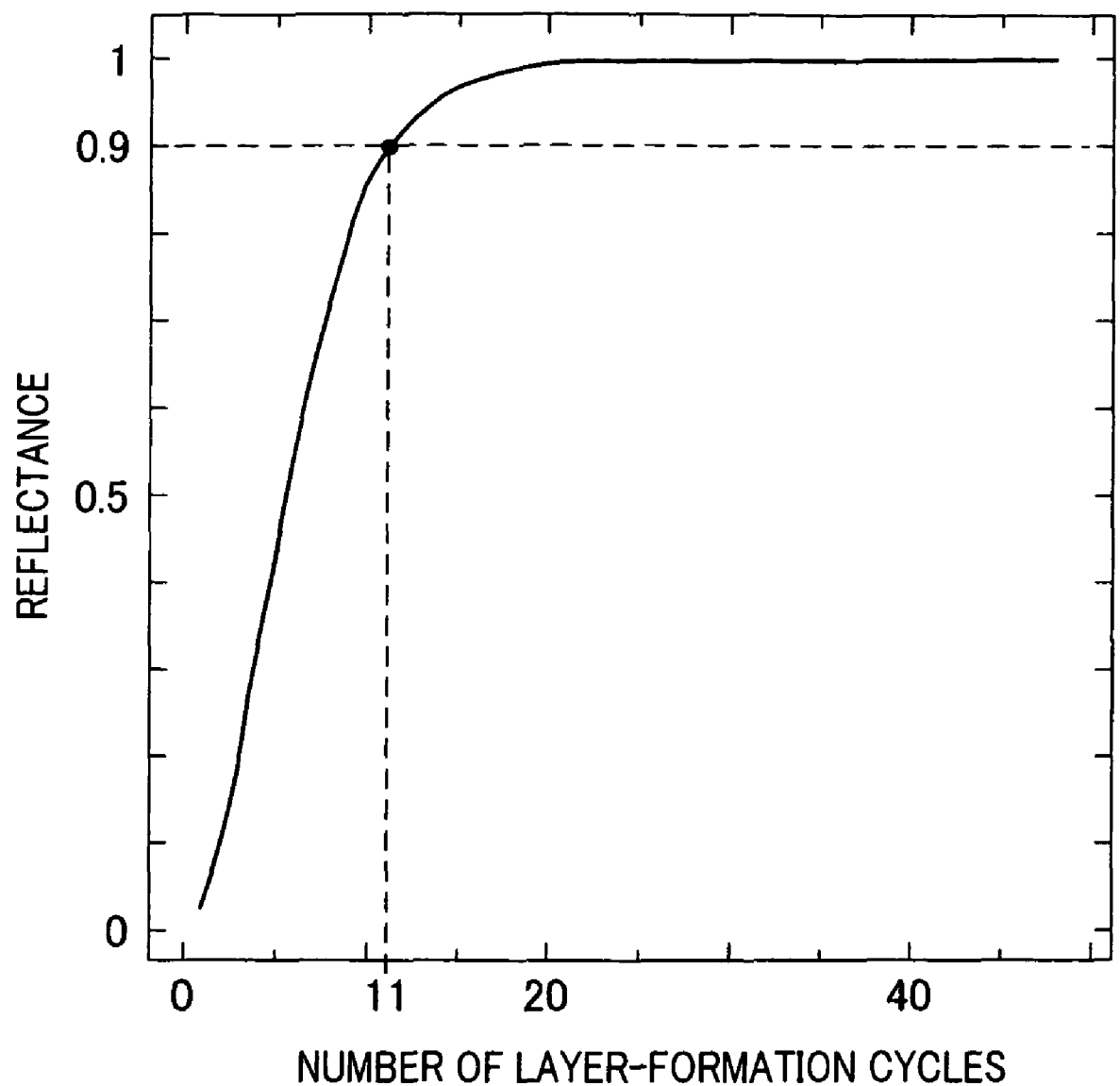
FIG. 3 is a graph illustrating the relationship between the number of layer-formation cycles and the reflectance.

At the last stage, also by the MBE method, the plural second reflection layers 12 made of GaAs and the plural first reflection layers 11 made of AlAs are alternately formed on top of the photo-current generating portion 2. Thus formed is the reflection portion 1 (see FIG. 2C). During these series of processes, the growth time is determined on the basis of each growth rate calculated beforehand so that each layer can have a designed film thickness. In accordance with the growth time thus determined, a control to open and close the cell shutters is carried out. Every time the growth of each of the second reflection layers 11 made of GaAs has been finished, a growth-interruption time of approximately 30 seconds is secured so as to obtain a flat interface. In contrast, the first reflection layers 11 made of AlAs are likely to take in impurities during the growth-interruption time. For this reason, no growth-interruption time is secured when the growth of each first reflection layer 11 is finished. In addition, the number of layers of the first reflection layers 11 and of the second reflection layers 12 is determined so that the formation of the pair of one first reflection layer 11 and one second reflection layer 12 may be repeated at least 11 times. This is because the reflectance of 90% or higher has to be secured for the rays in near-infrared range and in visible range. As FIG. 3 illustrates, such a reflectance can be secured with 11 cycles of forming the pair. Note that, in Embodiment 1, the wavelength of the rays emitted from the light emitting portion 3 is assumed to be 865 nm, the refractive index of each first reflective layer 11 $n_{(AlAs)}$=2.89, the refractive index of each second reflective layer 12 $n_{(GaAs)}$=3.41, the film thickness of each first reflective layer 11 $t_{(AlAs)}$=74.8 nm, and the film thickness of each second reflective layer 12 $t_{(GaAs)}$=63.4 nm.

When all the growth processes are over, the temperature of the GaAs substrate 10 is lowered down. Once the temperature becomes as low as 300° C., the As cell shutter is closed. When the temperature of the GaAs substrate 10 becomes as low as approximately the room temperature, the GaAs substrate 10 is taken out of the MBE chamber.

As has been described above, the use of a GaAs substrate in the method of manufacturing an infrared detector according to Embodiment 1 allows the infrared detector to have a large diameter. In addition, all the layers in the reflective portion 1, the photo-current generating portion 2, and the light emitting portion 3 are formed through only the crystal growth achieved through the processes of the technically-matured MBE method, so that the yield of the manufacturing of the infrared detectors becomes higher than the conventional method. Note that the order of forming the layers can be reversed to deal with the case of the back-side incidence.

3. Image-Sensor Formation Step

When the infrared detector of Embodiment 1 is formed as an image sensor with a large number of pixels, such an image sensor can be formed, after the above-described growth step, by the following manufacturing method.

The surface of the infrared detector that has been through the growth step is spin coated with a resist. Then the resist is baked to be hardened. With a mask to reduce the size down to that of the device, the resist is exposed to UV rays. Then, the detector with the resist is developed with a developer. With a sulfuric-acid etchant, the detector is etched until the layer on which the lower electrode is to be deposited is exposed. After that, the metal that is designed to be the lower electrode is deposited. When, for example, the layer on which the lower electrode is to be deposited is an n-type layer, AuGe (12%)/Ni/Au is deposited. When, for example, the layer on which the lower electrode is to be deposited is a p-type layer, AuSb (5%)/Ni/Au is deposited. The upper electrode that is to be described later is deposited in the same way. The metal thus deposited is lifted off together with the resist except for the portion that is to be used as the lower electrode. The planar shape of the lower electrode is, for example, a comb shape, or a "#" shape.

Figure 6:
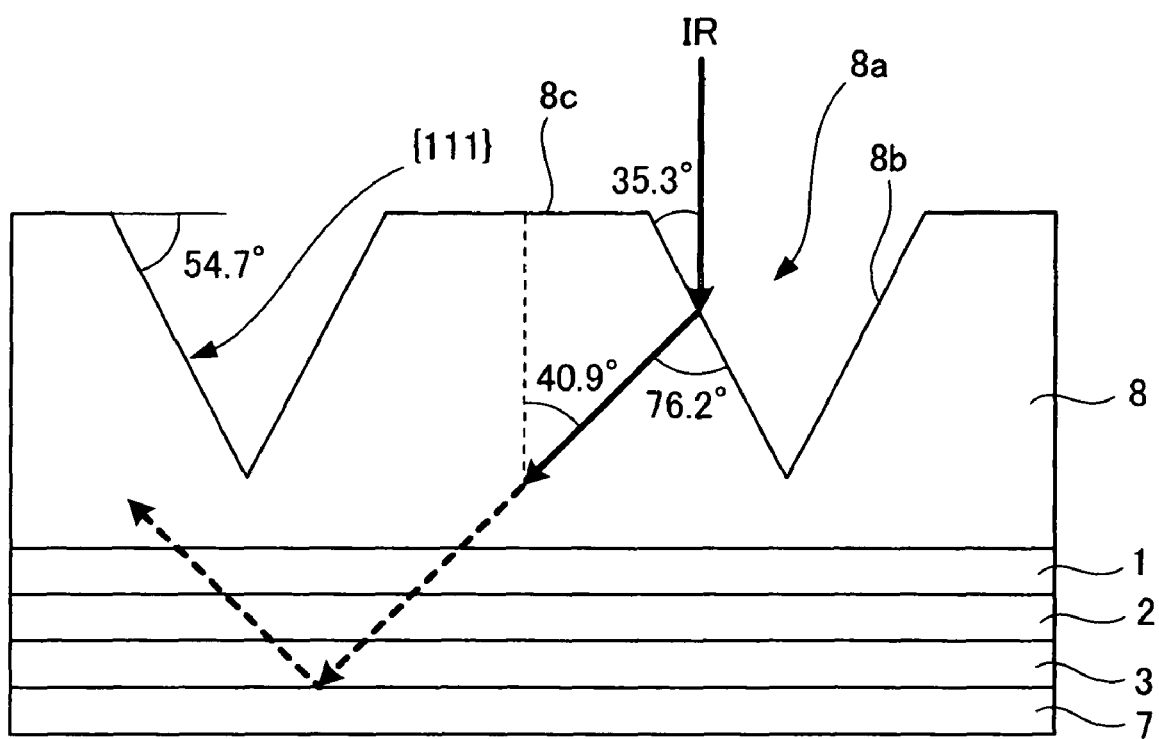
FIG. 6 is a diagram describing an infrared detector according to a third embodiment of the present invention.

When a refraction layer 8 that is to be described later (in Embodiment 3; see FIG. 6) is formed, a layer made of GaAs is formed in advance on top of the reflection portion 1 at the above-described step described under the section header "2. Growth Step." Then, processes can be carried out, at this step, on the surface of the refraction layer 8, which is to be the surface of the infrared detector. Specifically, the surface of the infrared detector is spin coated with a resist again, and the infrared detector with the resist is baked to harden the resist. With a mask of lines and spaces, the resist is exposed to UV rays. Then, the resist is developed with a developer. After that, the detector is etched with a sulfuric-acid etchant, so that the surface of the infrared detector is formed to have lines. To put it differently, the refraction layer 8 that FIG. 6 illustrates is thus formed. Note that the shape of the refraction layer 8 is not only the shape with lines but may also be a shape with dots.

At the last stage, the surface of the infrared detector is spin coated with a resist again, and the infrared detector with the resist is baked to harden the resist. With a mask for the upper electrode, the resist is exposed to UV rays. Then, the resist is developed with a developer. After that, the metal that is designed to be the upper electrode is deposited in an opening portion formed in the resist. The metal thus deposited is lifted off together with the resist except for the portion that is to be used as the upper electrode. The planar shape of the upper electrode is also, for example, a comb shape, or a "#" shape.

As has been described above, an image sensor with a large number of pixels can be formed readily according to the present invention.

Embodiment 2

Figure 4A:
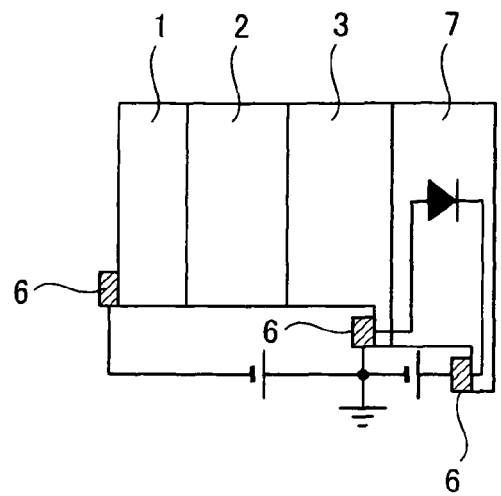
FIGS. 4A and 4B are diagrams describing an infrared detector according to a second embodiment of the present invention.
Figure 4B:
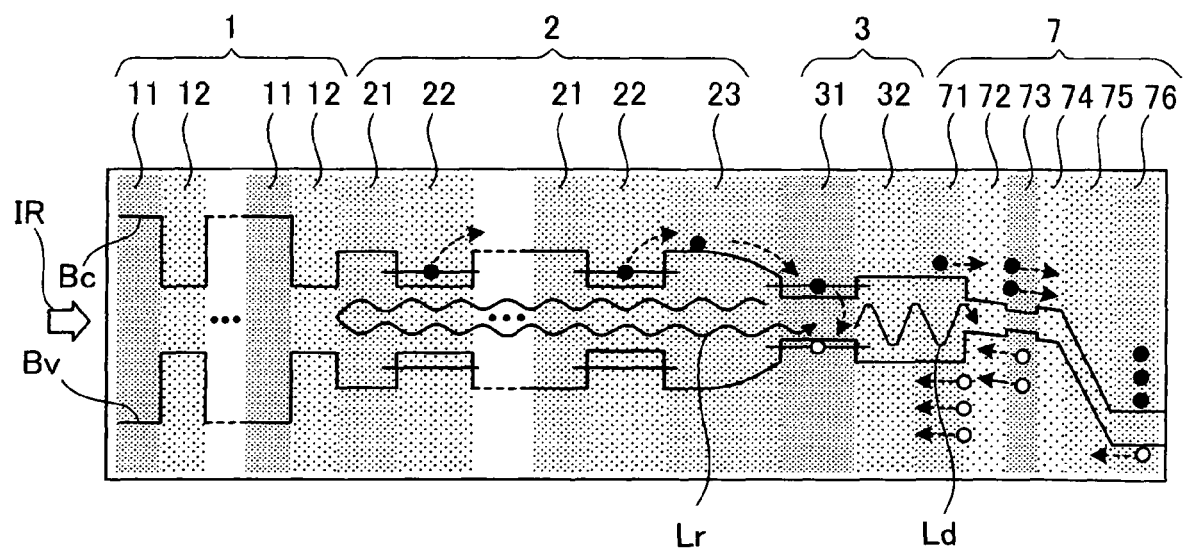
Figure 5A:
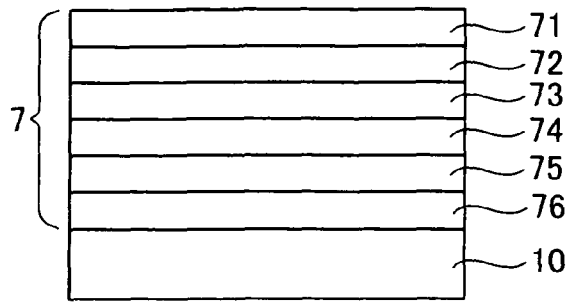
FIGS. 5A to 5D are diagrams describing a method of manufacturing the infrared detector illustrated in FIGS. 4A and 4B.
Figure 5C:
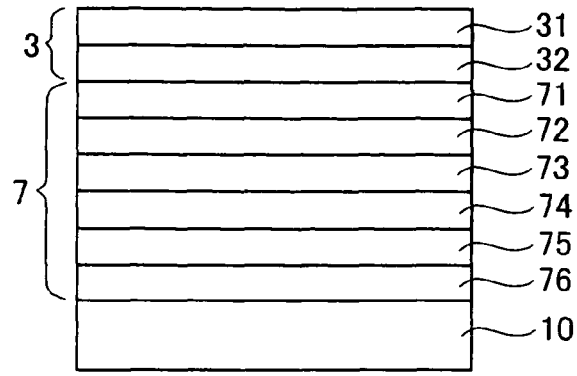
Figure 5B:
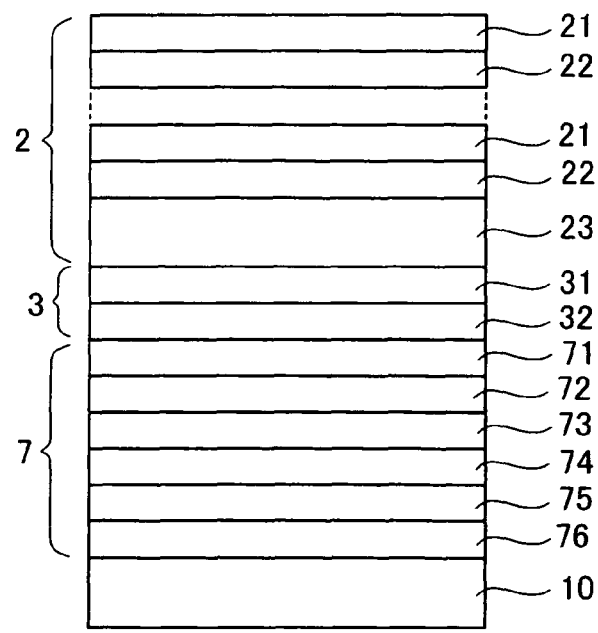
Figure 5D:
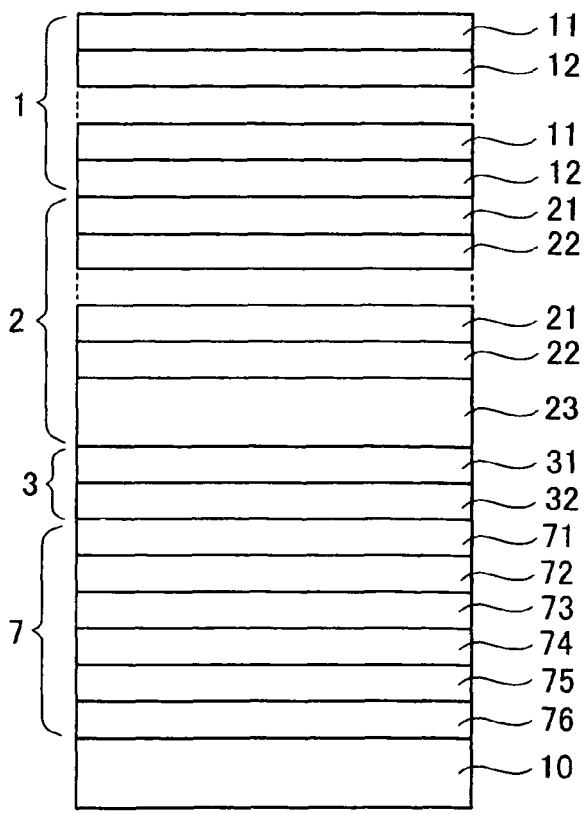

FIGS. 4A and 4B are diagrams describing an infrared detector according to a second embodiment of the present invention. FIG. 4A is a diagram describing, schematically, the configuration of the infrared detector. FIG. 4B is a diagram describing the structure of the infrared detector and its energy bands. FIGS. 5A to D are diagrams describing a method of manufacturing the infrared detector. Note that in the following description those constituent elements of the infrared detector of Embodiment 2 that have their respective counterparts in the infrared detector of Embodiment 1 are denoted by the same reference numeral.

As FIG. 4A illustrates, the infrared detector of Embodiment 2 includes a reflection portion 1, a photo-current generating portion 2, a light emitting portion 3, and a photo-detecting portion 7. The reflection portion 1 transmits rays in the far-infrared range and in the middle-infrared range, but reflects rays in the near-infrared range and in the visible range. The photo-current generating portion 2 has a multiple quantum well structure. In the multiple quantum well structure, the rays in the far-infrared range and in the middle-infrared range that have passed through the reflection portion 1 excite electrons, and the electrons thus excited generate a photo current. The light emitting portion 3 has a single quantum well structure. The electrons of the photo current thus generated in the photo-current generating portion 2 are injected into the single quantum well structure, and are recombined with the holes. Consequently, rays in the near-infrared range and in the visible range are emitted from the light emitting portion 3. The photo-detecting portion 7 detects the rays in the near-infrared range and in the visible range thus emitted from the light emitting portion 3. Some of the rays in the near-infrared range and in the visible range that are emitted from the light emitting portion 3 are reflected by the reflection portion 1. These rays reflected by the reflection portion 1 are also detected by the photo-detecting portion 7. The reflection portion 1, the photo-current generating portion 2, the light emitting portion 3, and the photo-detecting portion 7 are layered so as to form a single, united body of the infrared detector of Embodiment 2.

The light emitting portion 3 and the photo-detecting portion 7 share a single ground electrode 6 disposed therebetween. A positive electrode 6 and a negative electrode 6 are disposed respectively at the two end portions of the infrared detector. The infrared detector is driven by the application of a predetermined voltage to the entirety of the infrared detector. To electrically connect each of the electrodes 6 to the infrared detector, contact layers (not illustrated) are provided. Note that a barrier layer 32 and an APD upper-electrode layer 71 are provided to serve as the contact layers for the electrodes 6 that are connected respectively to the light emitting portion 3 and to the photo-detecting portion 7 (see FIGS. 4A to 4B and 5A to 5D).

In the infrared detector of Embodiment 2, all of the reflecting portion 1, the photo-current generating portion 2, the light emitting portion 3, and the photo-detecting portion 7 are each made of a group III-V compound semiconductor (for example, a GaAs-based material). In the infrared detector, layers of the photo-detecting portion 7, the light emitting portion 3, the photo-current generating portion 2, and the reflecting portion 1 are formed, in this order, on top of a substrate made of a group III-V compound semiconductor (for example, a GaAs substrate) so as to form a single, united body.

The infrared detector of Embodiment 1 is formed by bonding the first element and the second element with the bonding portion 5 located in between. For this reason, defects of the bonding portion 5 or the like may cause a loss of the rays in the near-infrared range and in the visible range emitted from the light emitting portion 3. The entire infrared detector of Embodiment 2, however, is formed, as a single united body, through only the crystal growth accomplished by the MBE method (the formation of the infrared detector will be described later). Accordingly, the infrared detector of Embodiment 2 has no bonding portion 5 in the first place. This is why the infrared detector of Embodiment 2 can achieve reduction in the loss of the rays in the near-infrared range and in the visible range emitted from the light emitting portion 3 and can have further improved detection efficiency.

More specific element structure will be described with reference to FIG. 4B.

The reflecting portion 1 includes first reflection layers 11 and second reflection layers 12. The refractive index of each first reflection layer 11 is different from that of each second reflection layer 12. The reflecting portion 1 has a structure in which the plural first reflection layers 11 and the plural second reflection layers 12 are formed alternately and cyclically so that distributed Bragg reflection of the rays in the near-infrared range and in the visible range can be caused. As to the materials used for these layers, the first reflection layers 11 are made, for example, of AlAs while the second reflection layers 12 are made, for example, of GaAs.

The photo-current generating portion 2 includes barrier layers 21 and well layers 22. Each well layer 22 is designed to function as a quantum well. The multiple layers formed with the well layers 22 each of which is sandwiched by the barrier layers 21 form the multiple quantum well structure of the photo-current generating portion 2. The photo-current generating portion 2 has a structure equivalent to what is known as a QWIP, and has a superlattice structure with the barrier layers 21 made, for example, of AlGaAs and the well layers 22 made, for example, of GaAs. There are things that have to be noted concerning one of the barrier layers 21 adjacent to the light emitting portion 3 (hereafter, that barrier layer 21 will be referred to as a barrier layer 23). While the composition of the barrier layer 23 is basically the same as the composition of the other barrier layers 21, the proportion of each constituent of the barrier layer 23 is gradually changing in the film-thickness direction of the barrier layer 23 for the reasons to be described later. Consequently, the band gap is gradually narrowed towards the light emitting portion 3. In addition, the film thickness of the barrier layer 23 is larger than that of each barrier layer 21, but thinner than the electron mean free path.

The light emitting portion 3 includes a well layer 31 and a barrier layer 32. In the single quantum well structure of the light emitting portion 3, the well layer 31, which is designed to function as a quantum well, is sandwiched by the barrier layer 32 of the light emitting portion 3 and the adjacent barrier layer 23 of the photo-current generating portion 2 so as to form a band gap that is to emit rays in the near-infrared range and in the visible range. As to the materials used for these layers, the well layer 31 is made, for example, of InGaAs while the barrier layer 32 is made, for example, of GaAs. Alternatively, the barrier layer 32 may be made of AlGaAs. In addition, the barrier layer 32 serves also as a contact layer that the electrode 6 is connected to.

The photo-detecting portion 7 includes the above-mentioned APD upper-electrode layer 71, a spacer layer 72, a light absorbing layer 73, a spacer layer 74, a multiplication layer 75, and an APD lower-electrode layer 76. These layers are sequentially formed one upon another to form the photo-detecting portion 7. To put it differently, in Embodiment 2, an APD serves as what is termed the second element in Embodiment 1. The photo-detecting portion 7 may be made of GaAs alone, but, in Embodiment 2, the APD upper-electrode layer 71 is made of AlGaAs, the light absorbing layer 73 is made of InGaAs, the spacer layers 72 and 74 are made of AlGaAs, the multiplication layer 75 is made of AlGaAs, and the APD lower-electrode layer 76 is made of AlGaAs. Note that the light absorbing layer 73 is made of InGaAs as in the case of the well layer 31 of the light emitting portion 3. Accordingly, the emitted rays are absorbed by the light absorbing layer 73 with an InGaAs composition that has an emitting wavelength close to that of the InGaAs composition of the light emitting portion 3. This can improve the absorption efficiency.

The infrared detector of Embodiment 2 is configured to have the following detection target wavelength. The rays in the far-infrared range and in the middle-infrared range that excite the electrons in the photo-current generating portion 2 have a wavelength ranging from 3 μm to 10 μm. The rays in the near-infrared range and in the visible range that are detected by the photo-detecting portion 7 have a wavelength ranging from 820 nm to 1000 nm.

Next, the operational principle of the infrared detector of Embodiment 2 will be described with reference to the energy bands that FIG. 4B illustrates. In FIG. 4B, Bc represents the conduction band, and Bv represents the valence band. Rays in the far-infrared range and in the middle-infrared range, which are denoted by IR, enter the infrared detector from the left-hand side of the drawing.

As FIG. 4B illustrates, quantum wells are formed in the photo-current generating portion 2 by sandwiching each well layer 22 between the adjacent barrier layers 21, and the electrons (represented by black circles in the drawing) exist in the quantum wells and at the energy level of the conduction-band side (Bc side). These electrons are excited by absorbing the incident rays in the far-infrared range and in the middle-infrared range. The electrons transfer among the multiple quantum wells, and are eventually injected into the well layer 31 of the light emitting portion 3 via the barrier layer 23 (see, the arrowed dot-lines). Here, the electrons having been generated in the photo-current generating portion 2 can be efficiently injected into the well layer 31 of the light emitting portion 3 without scatter by setting appropriately the composition and the film thickness of the barrier layer 23 (detailed description for the settings will be given later).

As FIG. 4B illustrates, a quantum well is formed in the light emitting portion 3, as well, by sandwiching the well layer 31 between the barrier layer 23 and the barrier layer 32. In the well layer 31, holes (represented by the white circle in the drawing) exist at the energy level of the valence-band side (Bv side). The holes and the electrons injected into the well layer 31 are recombined in the well layer 31, so that rays in the near-infrared range and in the visible range, which have larger energy, can be emitted.

The rays in the near-infrared range and in the visible range are emitted mainly in the stacking direction of the layers of the infrared detector of Embodiment 2 (the horizontal direction in the drawing). The rays in the near-infrared range and in the visible range emitted to the side of the photo-detecting portion 7 (such rays are represented by Ld in the drawing) enter directly the photo-detecting portion 7, and the intensity of the rays Ld is measured by the photo-detecting portion 7. On the other hand, the rays in the near-infrared range and in the visible range emitted to the side of the reflection portion 1 (such rays are represented by Lr in the drawing) are reflected with high efficiency by the distributed Bragg reflection that occurs in the reflection portion 1, and then enter the photo-detecting portion 7. The intensity of the rays thus entered the photo-detecting portion 7 is measured by the photo-detecting portion 7. As a consequence, the rays in the near-infrared range and in the visible range emitted from the light emitting portion 3 can be detected by the photo-detecting portion 7 with high efficiency.

The photo-detecting portion 7 is reversely biased, so that a high electrical field is formed in the depletion layer within the light absorbing layer 73. The rays that have entered the photo-detecting portion 7 are absorbed by the light absorbing layer 73 so that electron-hole pairs are formed. These carriers (i.e., the electrons and the holes) are accelerated by the high electrical field. The accelerated carriers with high energy collide with the lattice, so that secondary electron-hole pairs are formed. Such a process is repeated in the multiplication layer 75, so that the carriers are avalanche-multiplied. The carriers thus multiplied drift, so that the photo-current is generated. In summary, the rays in the far-infrared range and in the middle-infrared range incident into the infrared detector can be efficiently detected by detecting, with the photo-detecting portion 7, the rays in the near-infrared range and in the visible range emitted by the light emitting portion 3 and amplified by the photo-detecting portion 7.

As has been described above, the infrared detector of Embodiment 2 has a wavelength-conversion function to convert the rays in the far-infrared range and in the middle-infrared range that have entered the infrared detector into the rays in the near-infrared range and in the visible range that have larger energy than the rays in the far-infrared range and in the middle-infrared range. The wavelength conversion is accomplished by making the light emitting portion 3 emit the rays in the near-infrared range and in the visible range. To this end, the electrons generated in the photo-current generating portion 2 by the incident rays in the far-infrared range and in the middle-infrared range are recombined with the holes in the light emitting portion 3. Besides the wavelength-conversion function, the infrared detector of Embodiment 2 has an optical confinement function to confine the rays that have been converted into the rays in near-infrared range and in the visible range to the inside of the infrared detector. To this end, the reflection portion 1 reflects the rays in the near-infrared range and in the visible range that have been emitted by the light emitting portion 3. In addition, the infrared detector of Embodiment 2 has an avalanche-multiplication function to avalanche multiply the electrons generated by the incident rays in the near-infrared range and in the visible range emitted by the light emitting portion 3. To this end, the photo-detecting portion 7 has an APD structure. In summary, the infrared detector of Embodiment 2 is formed as a united body by combining together the photo-current generating portion 2 that has a QWIP structure, the light emitting portion 3 that has the wavelength-conversion function, the reflection portion 1 that has the optical confinement function, and the photo-detecting portion 7 that has the avalanche-multiplication function. The rays in the near-infrared range and in the visible range that have been subjected to the wavelength conversion are confined to the inside of the single infrared detector, then are amplified, and then detected by the same single infrared detector. For this reason, in comparison to the ordinary QWIP-type infrared detectors and to the infrared detector of Embodiment 1, the infrared detector of Embodiment 2 can accomplish an improvement in the detection efficiency (i.e., an improved S/N ratio).

Note that the photo-current generating portion 2 and the light emitting portion 3 described above in Embodiment 2 are also n-type devices that employ electrons as the carriers. Alternatively, the photo-current generating portion 2 and the light emitting portion 3 may be p-type devices that employ holes as the carriers. Although the operational principle of this case is the same as in the above-described case of Embodiment 2 with electrons as the carriers, there are differences between these cases in the barrier heights of the conductive band and of the valence band as well as in the effective mass. Accordingly, the photo-current generating portion 2 and the light emitting portion 3 of the case with holes as the carriers have to be configured appropriately by taking these differences into account.

Next, a method of manufacturing an infrared detector according Embodiment 2 will be described with reference to FIG. 5A to 5D.

1. Preparation Step

To begin with, a GaAs substrate 10 is subjected to an ultrasonic cleaning process using an organic alkali solvent, such as Semicoclean (trade name), and is then subjected to another ultrasonic cleaning process using ultrapure water. After the cleaning processes, the GaAs substrate 10 is brought into a pre-bake chamber, and is pre-baked (approximately at 200° C.) under an ultrahigh vacuum condition (approximately, at a pressure ranging from $1 \times 10^{-7}$ torr to $1 \times 10^{-10}$ torr) so as to remove the moisture.

In the meanwhile, Ga, Al, As, and In are heated to a high temperature in an MBE chamber, and the molecular beam pressure of each substance is measured. Then, the growth rates of GaAs, AlAs, AlGaAs, and InGaAs are measured by opening the molecular beam cell shutters when necessary. For example, when the growth rate of GaAs is measured, the As cell shutter, and the Ga cell shutter are opened so as to allow GaAs to grow. The occurrence of the GaAs growth has to be checked.

While the As pressure is set at around $1\times10^{-5}$ torr, the GaAs substrate 10 from which the moisture has been removed is brought into the MBE chamber. The GaAs substrate 10 is then heated up to 580° C. In this event, while the temperature is 300° C. or higher, the As cell shutter is opened to avoid the separation of As.

2. Growth Step

The APD lower-electrode layer 76 made of AlGaAs, the multiplication layer 75 made of AlGaAs, the spacer layer 74 made of AlGaAs, the light absorbing layer 73 made of InGaAs, the spacer layer 72 made of AlGaAs, and the APD upper-electrode layer 71 made of AlGaAs are sequentially formed on top of the GaAs substrate 10 by the MBE method. Thus formed is the photo-detecting portion 7 (see FIG. 5A). During these series of processes, the growth time is determined on the basis of each growth rate calculated beforehand so that each layer can have a designed film thickness. In accordance with the growth time thus determined, a control to open and close the cell shutters is carried out. Every time the growth of each of the APD lower-electrode layer 76, the multiplication layer 75, the spacer layers 72 and 74, and the APD upper-electrode layer 71, all of which are made of AlGaAs, has been finished, a growth-interruption time of approximately 30 seconds is secured so as to obtain a flat interface.

The APD upper-electrode layer 71 together with the barrier layer 32 function as contact layers that the common electrode is deposited onto. The common electrode is deposited onto the APD upper-electrode layer 71 and onto the barrier layer 32 at a step to be described later under the section header "3. Image-Sensor Formation Step." Accordingly, the APD upper-electrode layer 71 and the barrier layer 32 may have completely the same composition. For example, when the APD upper-electrode layer 71 is made of p-type $Al_{0.1}Ga_{0.9}As$, the barrier layer 32 may be made of the same p-type $Al_{0.1}Ga_{0.9}As$. In this case, the APD upper-electrode layer 71 and the barrier layer 32 are formed continuously by the MBE method so as to form a thick layer (for example, with a thickness of 1 µm, approximately). Needless to say, the composition of the APD upper-electrode layer 71 may be determined in accordance with the composition of the barrier layer 32. For example, when the barrier layer 32 is made of p-type GaAs as in the case to be described later, the APD upper-electrode layer 71 may be made of the same p-type GaAs.

The barrier layer 32 made of GaAs is formed on top of the photo-detecting portion 7 by the MBE method, and then the well layer 31 made of InGaAs is formed on top of the barrier layer 32 by the same method. Thus formed is the light emitting portion 3 (see FIG. 5B). During these series of processes, the growth time is determined on the basis of each growth rate calculated beforehand so that each layer can have a designed film thickness. In accordance with the growth time thus determined, a control to open and close the cell shutters is carried out. Once the growth of the barrier layer 32 made of GaAs has been finished, a growth-interruption time of approximately 30 seconds is secured so as to obtain a flat interface. The well layer 31 has to be lower than the band gap of the barrier layer 32, so that the In composition is increased as much as possible. However, there are some things that have to be noted as to the increasing of the In composition. As the In composition increases, the layer (flat plane) becomes thinner and thinner. For example, with the In composition of 0.2, the well layer 31 has a thickness of 4.2 nm or smaller. With the well layer 31 of 4.2-nm or larger thickness, a quantum dot is produced. With the In composition of 0.3, the well layer 31 has a thickness of 1.7 nm or smaller. When the well layer 31 is too thin, the light-emitting efficiency is impaired. For this reason, the well layer 31 preferably has a 1-nm thickness, at least. Accordingly, in accordance with the In composition, the film thickness of the well layer 31 is set at an appropriate range.

Subsequently, the barrier layer 23 made of AlGaAs is formed on top of the light emitting portion 3 by the MBE method as in the case of the formation of the barrier layer 32 and the well layer 31. Also by the MBE method, the plural well layers 22 made of GaAs and the plural barrier layers 21 made of AlGaAs are alternately formed on top of the barrier layer 23. Thus formed is the photo-current generating portion 2 (see FIG. 5C). During these series of processes, the growth time is determined on the basis of each growth rate calculated beforehand so that each layer can have a designed film thickness. In accordance with the growth time thus determined, a control to open and close the cell shutters is carried out. Every time the growth of each of the barrier layers 21 and 23 made of AlGaAs or the growth of each of the well layers 22 made of GaAs has been finished, a growth-interruption time of approximately 30 seconds is secured so as to obtain a flat interface. In addition, the number of layers of the barrier layers 21 and of the well layers 21 is determined normally so that the formation of the pair of one barrier layer 21 and one well layer 22 may be repeated 50 to 100 times.

Each of the barrier layers 21 has a 25-nm thickness, at least. Such a thickness is large enough to prevent the electrons confined in each well layer 22 from reacting with the electrons of the well layers 22 located next to the barrier layers 21 that are adjacent to that well layer 22. Normally, the thickness of each barrier layer 21 is set at 25 nm to 50 nm. On the other hand, the composition and the film thickness of each of the well layers 22 have to be changed in accordance with the range of the detection-target wavelength. Normally, the thickness of each well layer 22 is several nanometers. In Embodiment 2, the composition ratio is 0.6, and the film thickness is 3 nm.

While the composition of the barrier layer 23 is basically the same as the other barrier layers 21, the proportion of Al is gradually reduced towards the light emitting portion 3. In addition, the film thickness of the barrier layer 23 is larger than each of the barrier layers 21. This is because it is preferable for the barrier layer 23 to inject the electrons generated in the photo-current generating portion 2 into the well layer 31 of the light emitting portion 3 efficiently without causing the scattering of the electrons. When, for example, the barrier layer 23 has the same composition as that of each barrier layer 21, the entire potential difference caused by the electrical field applied to the barrier layer 23 becomes the barrier. For this reason, in order to make the barrier (potential difference) as low as possible, the Al composition of the barrier layer 23 is gradually reduced towards the light emitting portion 3. Accordingly, the growth of the barrier layer 23 is carried out by a method which is based on the growth method of the barrier layers 21 but in which the Al composition is gradually reduced by closing, gradually, the Al cell shutter.

The film thickness of the barrier layer 23 is smaller than the electron mean free path (the distance that the electrons can travel without being scattered) so as to cause the least possible scattering of the electrons. Suppose a case, for example, where the bulk GaAs mobility (77 K, $1\times10^{16}$ cm$^{-3}$) $\mu$=20000 cm$^2$/Vs, the GaAs electron effective mass m*=0.067

$m_o=0.067\times9.1\times10^{-31}$, the collisional relaxation time $\tau=\mu m^*/e=0.76$ ps, the electron velocity (high electrical field) $v=1.0\times10^7$ cm/s. In this case, the electron mean free path $L=v\times\tau=76$ nm. Accordingly, the film thickness of the barrier layer 23 is 76 nm or smaller. In addition, since each barrier layer 21 has a thickness of 25 nm or larger, the barrier layer 23 is designed to have a thickness of 50 nm or larger.

At the last stage, also by the MBE method, the plural second reflection layers 12 made of GaAs and the plural first reflection layers 11 made of AlAs are alternately formed on top of the photo-current generating portion 2. Thus formed is the reflection portion 1 (see FIG. 5D). During these series of processes, the growth time is determined on the basis of each growth rate calculated beforehand so that each layer can have a designed film thickness. In accordance with the growth time thus determined, a control to open and close the cell shutters is carried out. Every time the growth of each of the second reflection layers 12 made of GaAs has been finished, a growth-interruption time of approximately 30 seconds is secured so as to obtain a flat interface. In contrast, the first reflection layers 11 made of AlAs are likely to take in impurities during the growth-interruption time. For this reason, no growth-interruption time is secured when the growth of each first reflection layer 11 is finished. In addition, the number of layers of the first reflection layers 11 and of the second reflection layers 12 is determined so that the formation of the pair of one first reflection layer 21 and one second reflection layer 12 may be repeated at least 11 times. This is because the reflectance of 90% or higher has to be secured for the rays in near-infrared range and in visible range. As FIG. 3 illustrates, such a reflectance can be secured with 11 cycles of forming the pair. Note that, also in Embodiment 2, the wavelength of the rays emitted by the light emitting portion 3 is assumed to be 865 nm, the refractive index of each first reflective layer 11 $n_{(AlAs)}=2.89$, the refractive index of each second reflective layer 12 $n_{(GaAs)}=3.41$, the film thickness of each first reflective layer 11 $t_{(AlAs)}=74.8$ nm, and the film thickness of each second reflective layer 12 $t_{(GaAs)}=63.4$ nm.

When all the growth processes are over, the temperature of the GaAs substrate 10 is lowered down. Once the temperature becomes as low as 300° C., the As cell shutter is closed. When the temperature of the GaAs substrate 10 becomes as low as approximately the room temperature, the GaAs substrate 10 is taken out of the MBE chamber.

As has been described above, the use of a GaAs substrate in the method of manufacturing an infrared detector according to Embodiment 2 allows the infrared detector to have a large diameter. In addition, all the layers in the reflective portion 1, the photo-current generating portion 2, the light emitting portion 3, and the photo-detecting portion 7 are formed only through the crystal growth achieved through the processes of the technically-matured MBE method, so that the yield of the manufacturing of the infrared detectors becomes higher than the conventional method. Note that the order of forming the layers can be reversed to deal with the case of the back-side incidence.

3. Image-Sensor Formation Step

When the infrared detector of Embodiment 2 is formed as an image sensor with a large number of pixels, such an image sensor can be formed, after the above-described growth step, by the following manufacturing method.

The surface of the infrared detector that has been through the growth step is spin coated with a resist. Then the resist is baked to be hardened. With a mask to reduce the size down to that of the device, the resist is exposed to UV rays. Then, the detector with the resist is developed with a developer. With a sulfuric-acid etchant, the detector is etched until the n-type APD lower-electrode layer 76 onto which the lower electrode for the APD is to be deposited is exposed. After that, the metal [AuGe(12%)/Ni/Au] that is designed to be the lower electrode for the APD is deposited onto the n-type APD lower-electrode layer 76. The metal thus deposited is lifted off together with the resist except for the portion that is to be used as the lower electrode for the APD. The planar shape of the lower electrode for the APD is, for example, a comb shape, or a "#" shape.

Subsequently, the surface of the infrared detector is spin coated with a resist again. Then the resist is baked to be hardened. With a mask for the common electrode that is to serve both as the upper electrode for the APD and as the lower electrode for the QWIP, the resist is exposed to UV rays. Then, the detector with the resist is developed with a developer. With a sulfuric-acid etchant, the detector is etched until the barrier layer 32 onto which the common electrode is to be deposited is exposed. After that, the metal [AuSb(5%)/Ni/Au] that is designed to be the common electrode is deposited onto the p-type barrier layer 32. The metal thus deposited is lifted off together with the resist except for the portion that is to be used as the common electrode, that is, the ground electrode 6. The planar shape of the common electrode is also, for example, a comb shape, or a "#" shape.

When a refraction layer 8 that is to be described later (in Embodiment 3; see FIG. 6) is formed, a layer made of GaAs is formed in advance on top of the reflection portion 1 at the above-described step described under the section header "2. Growth Step." Then, processes can be carried out, at this step, on the surface of the refraction layer 8, which is to be the surface of the infrared detector. Specifically, the surface of the infrared detector is spin coated with a resist again, and the infrared detector with the resist is baked to harden the resist. With a mask of lines and spaces, the resist is exposed to UV rays. Then, the resist is developed with a developer. After that, the detector is etched with a sulfuric-acid etchant, so that the surface of the infrared detector is formed to have lines. To put it differently, the refraction layer 8 that FIG. 6 illustrates is thus formed. Note that the shape of the refraction layer 8 is not only the shape with lines but may also be a shape with dots.

At the last stage, the surface of the infrared detector is spin coated with a resist again, and the infrared detector with the resist is baked to harden the resist. With a mask for the upper electrode, the resist is exposed to UV rays. Then, the resist is developed with a developer. After that, the metal that is designed to be the upper electrode is deposited in an opening portion formed in the resist. The metal thus deposited is lifted off together with the resist except for the portion that is to be used as the upper electrode. The planar shape of the upper electrode is also, for example, a comb shape, or a "#" shape.

As has been described above, an image sensor with a large number of pixels can be formed readily according to the present invention.

Embodiment 3

FIG. 6 is a diagram describing an infrared detector according to a third embodiment of the present invention. Note that the content of Embodiment 3 is implemented on the basis of the infrared detector of Embodiment 2, so that in the following description those constituent elements of the infrared detector of Embodiment 3 that have their respective counterparts in the infrared detector of Embodiment 2 are denoted by the same reference numeral. Needless to say, the content of Embodiment 3 can be implemented on the basis of the infrared detector of Embodiment 1.

As FIG. 6 illustrates, the infrared detector of Embodiment 3 includes a refraction layer 8 located on the incident surface side. The refraction layer 8 refracts the incident angle of the incident rays in the far-infrared range and in the middle-infrared range that enters perpendicularly the incident surface. Specifically, the refraction layer 8 made of GaAs is formed, firstly, through the crystal growth carried out by the MBE method on top of the reflection portion 1 with the (001) surface being the top surface. Then, the top surface of the refractive layer 8 is wet-etched with, for example, a mixed solution of sulfuric acid and a hydrogen-peroxide based solution, or an ammonia based solution so as to form cutaways of V-shaped grooves 8a. Thus formed are sloping faces 8b of the {111} surface. Here, each sloping face 8b is inclined at an angle of a 54.7° from the original top surface of the refractive layer 8.

Accordingly, the rays in the far-infrared range and in the middle-infrared range IR perpendicularly-incident into the infrared detector of Embodiment 3 actually enter each of the sloping faces 8b at an angle of 35.3° with respect to the sloping face 8b. The rays thus entered are refracted so as to make an angle of 76.2° with respect to the sloping face 8a. Consequently, the rays enter the photo-current generating portion 2 of the infrared detector so as to make an angle of 40.9° with respect to the original incident direction that is perpendicular to the infrared detector.

Each sloping face 8b is preferably formed to make the perpendicularly-incident rays in the far-infrared range and in the middle-infrared range IR enter the sloping face 8b at Brewster's angle. However, as in the case of Embodiment 3, the sloping faces 8b may be formed by taking advantage of the etching characteristics of the GaAs layer of the (001) surface because the sloping faces 8b thus formed can make it possible to achieve an angle close to Brewster's angle.

In addition, the V-shaped grooves 8a may be formed in the entire top surface of the refractive layer 8 so that all the perpendicularly-incident rays in the far-infrared range and in the middle-infrared range IR can enter obliquely the sloping faces 8b. This configuration is preferable when the photo-current generating portion 2 is n-type. Alternatively, as FIG. 6 illustrates, the V-shaped grooves 8a and flat portions 8c may be alternately formed by means of a mask or the like so that the V-shaped grooves 8a can occupy the same area as the area occupied by the flat portions 8c. In this case, some of the perpendicularly-incident rays in the far-infrared range and in the middle-infrared range IR enter obliquely the sloping faces 8b of the V-shaped grooves 8a while the other part of the perpendicularly-incident rays in the far-infrared range and in the middle-infrared range IR enter the flat portion 8c without any refraction. This configuration is preferable when the photo-current generating portion 2 is p-type. The V-shaped grooves 8a may be formed in the top surface of the refraction layer 8 so as to form lines. Alternatively, the V-shaped grooves 8a may be formed so as to surround each of the flat portions 8c. To put it differently, the V-shaped grooves 8a may be shaped so as to leave dots of the flat portions 8c in the top surface of the refraction layer 8.

Conventional n-type QWIP-type infrared detectors are not sensitive to the incident rays that are perpendicular to the surface of the detectors, resulting in very low quantum efficiency. In contrast, the infrared detector of Embodiment 3 can achieve improved quantum efficiency and further improved the detection efficiency (i.e., S/N ratio) by means of the refraction layer 8 which is formed as the top surface of the detector and which refracts the perpendicularly-incident rays to achieve the oblique incidence of the refracted rays.

In addition, the refraction layer 8 is formed by the MBE method and by wet etching. The wet etching is carried out by taking advantage of the etching characteristics of the GaAs layer of the (001) surface. As a consequence, the formation of the refraction layer 8 can be achieved easily and with a low cost.

Embodiment 4

Figure 7:
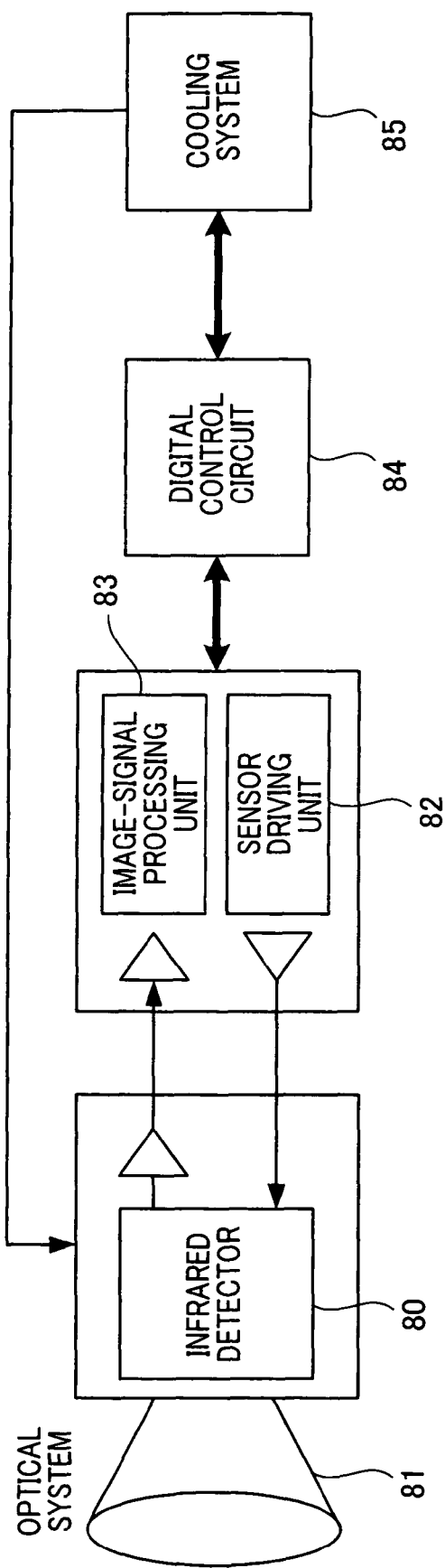
FIG. 7 is a block diagram illustrating an infrared detecting apparatus according to a forth embodiment of the present invention.
Figure 8:
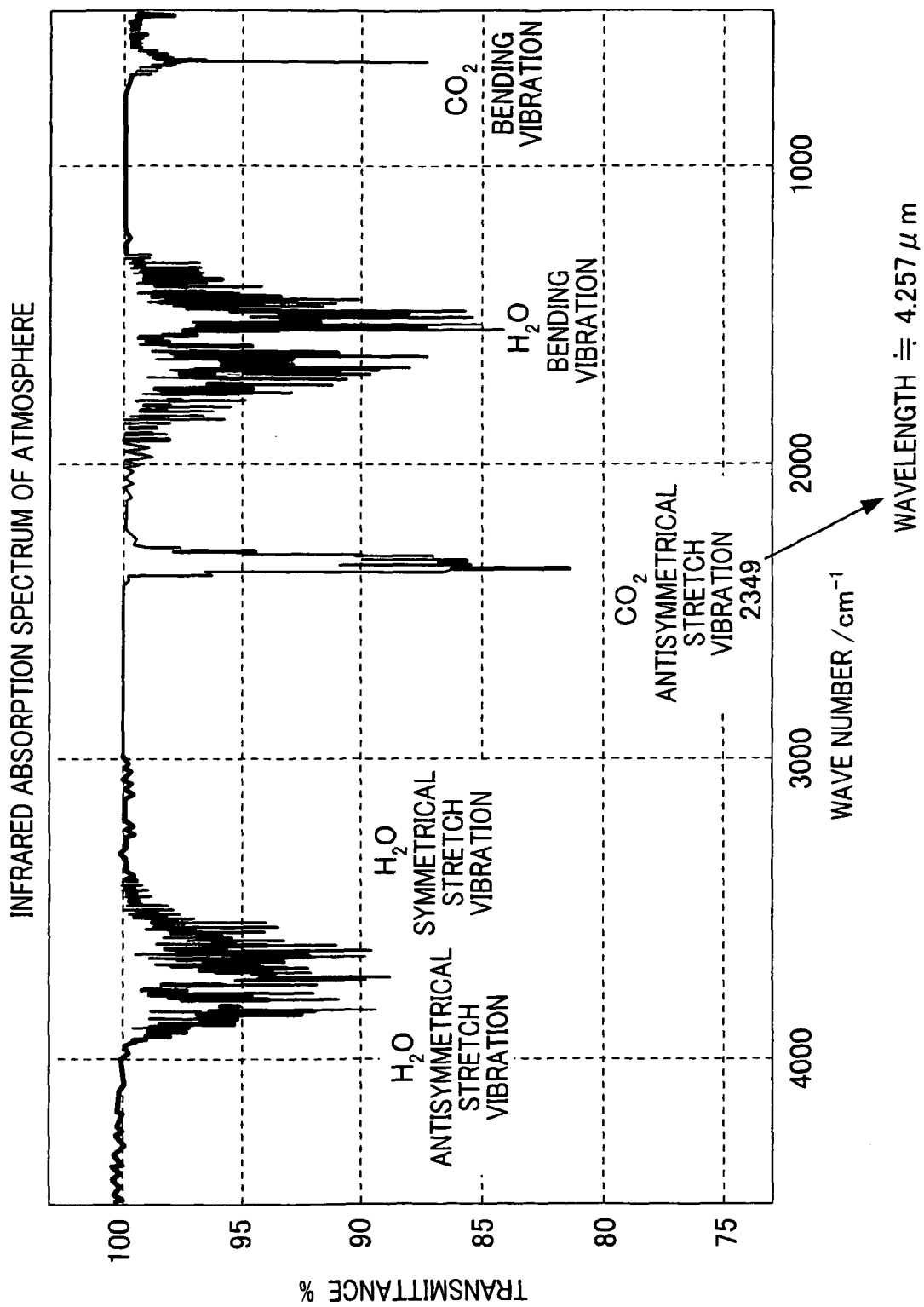
FIG. 8 is the infrared absorption spectrum of the atmosphere.

FIG. 7 is a block diagram illustrating an infrared detecting apparatus according to an embodiment of the present invention. The infrared detecting apparatus of Embodiment 4 includes an infrared detector 80, an optical system 81, a sensor driving unit 82, an image-signal processing unit 83, a digital control circuit 84, and a cooling system 85. The optical system 81 is disposed on the incident-surface side of the infrared detector 80. The sensor driving unit 82 drives and controls the infrared detector 80. The image-signal processing unit 83 executes the processing of the image signals detected by the infrared detector 80. The digital control circuit 84 controls the sensor driving unit 82 and the image-signal processing unit 83. The cooling system is controlled by the digital control circuit 84, and cools down the infrared detector 80.

Any one of the infrared detectors described in Embodiments 1 to 3 can be employed as the infrared detector 80 of Embodiment 4. Accordingly, as in the cases of Embodiments 1 to 3, the infrared detecting apparatus of Embodiment 4 can achieve improved detection efficiency (i.e., S/N ratio) in comparison to conventional infrared detecting apparatuses.

The infrared detecting apparatus with the above-described configuration can be mounted, for example, on a satellite to observe rays in a certain predetermined wavelength range from the surface of the globe. Such a use of the infrared detecting apparatus makes it possible to observe the state of the atmosphere of the globe and the state of the surface of the globe. In addition, when astronomical observation to observe the state of the celestial objects is carried out, the above-mentioned use of the infrared detecting apparatus can eliminate the influence of the infrared rays, which is not negligible in the case of the observation from the ground.

In addition, the infrared detecting apparatus can be adapted to observe a certain predetermined wavelength range by an appropriate configuration of the photo-current generating portion 2. Specifically, one of the things desired in view of the problem of global warming is highly efficient and highly accurate observation of carbon dioxide ($CO_2$) concentration in the atmosphere. The infrared detecting apparatus can be adapted to detect $CO_2$ concentration in atmosphere with high efficiency and high accuracy by precluding the influence of the infrared absorbing characteristics of other kinds of molecules. To this end, the quantum well structure of the photo-current generating portion 2 is configured appropriately so as to have infrared-detection sensitivity to a wavelength range including the absorption wavelength of $CO_2$ (4.257 μm, see FIG. 8). For example, the quantum well structure may be configured to have infrared-detection sensitivity to the wavelength range from 4 μm to 4.5 μm, inclusive.

For example, to attain a configuration that is suitable for the absorption wavelength of $CO_2$ (4.257 μm), each of the well layers 22 in the photo-current generating portion 2 has a 3.1-nm film thickness and is made of GaAs while each of the barrier layers 21 has a film thickness of 30 nm or larger and is made of $Al_{0.57}Ga_{0.43}As$.

When the infrared detection apparatus for $CO_2$ with the above-mentioned configuration is mounted on a satellite, $CO_2$ concentration in atmosphere all over the glove can be observed with high efficiency and high accuracy. The use of any one of the infrared detectors of Embodiments 1 to 3 allows the infrared detecting apparatus to have improved detection efficiency (i.e., S/N ratio) in comparison to conventional $CO_2$ detecting apparatus. In addition, the use of any one of the infrared detectors of Embodiments 1 to 3 allows the infrared detecting apparatus to preclude the influence of the other molecules.

The present invention is suitable for infrared sensors and infrared image sensors used for the remote sensing on the globe and for the astronomical observation.

What is claimed is:

1. An infrared detector comprising:
    a reflection portion which transmits rays in the far-infrared range and in the middle-infrared range and which reflects rays in the near-infrared range and in the visible range;
    a photo-current generating portion having a quantum well structure in which electrons are excited by the rays in the far-infrared range and in the middle-infrared range having passed through the reflection portion and in which the electrons thus excited generate photo-current;
    a light emitting portion having a quantum well structure into which electrons of the photo-current generated by the photo-current generating portion are injected and in which the electrons thus injected thereinto are recombined with holes so as to emit rays in the near-infrared range and in the visible range; and
    a photo-detecting portion which detects the rays in the near-infrared range and in the visible range emitted from the light emitting portion and which detects the rays in the near-infrared range and in the visible range emitted from the light emitting portion and reflected by the reflection portion, wherein
    at least the reflection portion, the photo-current generating portion, and the light emitting portion are made of group III-V compound semiconductors that are layered on top of a substrate, and
    incident rays in the far-infrared range and in the middle-infrared range are detected by the detection, performed by the photo-detecting portion, of the rays in the near-infrared range and in the visible range emitted from the light emitting portion.

2. The infrared detector according to claim 1, wherein
    the reflection portion, the photo-current generating portion, and the light emitting portion together form a first element,
    the photo-detecting portion forms an independent second element, and
    the first element and the second element are bonded together to form a single united body.

3. The infrared detector according to claim 1, wherein
    the reflection portion, the photo-current generating portion, the light emitting portion, the photo-detecting portion are all made of group III-V compound semiconductors, and are layered on the substrate made of a group III-V compound semiconductor so as to form a single united body.

4. The infrared detector according to claim 1, wherein the photo-detecting portion is made of an avalanche photo diode.

5. The infrared detector according to claim 1, wherein
    in the quantum well structure of the photo-current generating portion, a well layer that is designed to be a quantum well is sandwiched by barrier layers,
    a film thickness of a barrier layer which is included in the photo-current generating portion and which is adjacent to the light emitting portion is larger than a film thickness of each of the other barrier layers of the photo-current generation portion and is smaller than an electron mean free path, and
    a composition ratio of the barrier layer which is included in the photo-current generating portion and which is adjacent to the light emitting portion is gradually changed in the film-thickness direction so that a band gap is gradually narrowed down towards the light emitting portion.

6. The infrared detector according to claim 5, wherein, in the quantum well structure of the light emitting portion, a well layer which is included in the light emitting portion and which is designed to be a quantum well is sandwiched by a barrier layer of the light emitting portion and the barrier layer which is included in the photo-current generating portion and which is adjacent to the light emitting portion.

7. The infrared detector according to claim 1, wherein the reflection portion has a structure in which two different kinds of layers are alternately formed so as to cause distributed Bragg reflection of the rays in the near-infrared range and in the visible range, each of the layers of one kind having a refractive index that is different from a refractive index of each of the layers of the other kind.

8. The infrared detector according to claim 1 further comprising a refraction layer which is formed on the incident-surface side of the infrared detector and which refracts rays in the far-infrared range and in the middle-infrared range perpendicularly-incident into the incident surface so as to make the refracted rays enter obliquely the photo-current generating portion.

9. The infrared detector according to claim 1, wherein the quantum well structure of the photo-current generating portion is configured so that the electrons are excited by infrared rays in a wavelength range from 4 μm to 4.5 μm, which includes the 4.257-μm absorption wavelength of carbon dioxide.

10. An infrared detecting apparatus comprising the infrared detector according to claim 1.

11. A method of manufacturing an infrared detector comprising the steps of:
    forming a layer of a light emitting portion on top of a substrate, the light emitting portion having a quantum well structure in which electrons and holes are recombined together so that rays in the near-infrared range and in the visible range are emitted;
    forming a layer of a photo-current generating portion on top of the light emitting portion, the photo-current generating portion having a quantum well structure in which electrons are excited by rays in the far-infrared range and in the middle-infrared range, and photo-current that is to be injected into the light emitting portion is generated by the excited electrons;
    forming a layer of a reflection portion on top of the photo-current generating portion so as to form a first element, the reflection portion transmitting rays in the far-infrared range and in the middle-infrared range incident into the photo-current generating portion, and reflecting rays in the near-infrared range and in the visible range emitted from the light emitting portion towards a photo-detecting portion;
    forming an independent second element with the photo-detecting portion which detects the rays in near-infrared range and in the visible range emitted from the light emitting portion and which detects the rays in the near-infrared range and in the visible range emitted from the light emitting portion and reflected by the reflection portion; and bonding the first element and the second element to form a single united body, wherein at least the reflection portion, the photo-current generating portion, the light emitting portion are made of group III-V compound semiconductors by the same crystal-growth method, and thereby an infrared detector that detects the incident rays in the far-infrared range and in the middle-infrared range by making the photo-detecting portion detect the rays in the near-infrared range and in the visible range emitted from the light emitting portion is manufactured.

12. A method of manufacturing an infrared detector comprising the steps of:

forming a layer of a photo-detecting portion to detect rays in the near-infrared range and in the visible range on top of a substrate made of a group III-V compound semiconductor;

forming a layer of a light emitting portion on top of the photo-detecting portion, the light emitting portion having a quantum well structure in which electrons and holes are recombined together so that rays in the near-infrared range and in the visible range to be detected by the photo-detecting portion are emitted;

forming a layer of a photo-current generating portion on top of the light emitting portion, the photo-current generating portion having a quantum well structure in which electrons are excited by rays in the far-infrared range and in the middle-infrared range, and photo-current that is to be injected into the light emitting portion is generated by the excited electrons;

forming a layer of a reflection portion on top of the photo-current generating portion, the reflection portion transmitting rays in the far-infrared range and in the middle-infrared range incident into the photo-current generating portion, and reflecting rays in the near-infrared range and in the visible range that are emitted from the light emitting portion towards the photo-detecting portion, wherein all of the reflection portion, the photo-current generating portion, the light emitting portion, and the photo-detecting portion are made of group III-V compound semiconductors by the same crystal-growth method so as to form a single united body, and thereby an infrared detector that detects the incident rays in the far-infrared range and in the middle-infrared range by making the photo-detecting portion detect the rays in the near-infrared range and in the visible range emitted from the light emitting portion is manufactured.

13. The method of manufacturing an infrared detector according to claim 12, wherein an avalanche photo diode is formed as the photo-detecting portion.

14. The method of manufacturing an infrared detector according to claim 12, wherein as the quantum well structure of the photo-current generating portion, a structure is formed by sandwiching a well layer that is designed to be a quantum well between barrier layers, a barrier layer which is included in the photo-current generating portion and which is adjacent to the light emitting portion is formed in a film thickness which is larger than the film thickness of each of the other barrier layers of the photo-current generation portion and which is smaller than an electron mean free path, and the barrier layer which is included in the photo-current generating portion and which is adjacent to the light emitting portion is formed to have a composition ratio that is gradually changed in the film-thickness direction so that a band gap is gradually narrowed down towards the light emitting portion.

15. The method of manufacturing an infrared detector according to claim 14, wherein, as the quantum well structure of the light emitting portion, a structure is formed by sandwiching a well layer which is included in the light emitting portion and which is designed to be a quantum well between a barrier layer of the light emitting portion and the barrier layer which is included in the photo-current generating portion and which is adjacent to the light emitting portion.

16. The method of manufacturing an infrared detector according to claim 12, wherein as the reflection portion, a structure is formed by alternately forming two different kinds of layers so as to cause distributed Bragg reflection of the rays in the near-infrared range and in the visible range, each of the layers of one kind having a refractive index that is different from a refractive index of each of the layers of the other kind.

17. The method of manufacturing an infrared detector according to claim 12 further comprising a step of forming a refraction layer on the incident-surface side of the infrared detector, the refraction layer refracting rays in the far-infrared range and in the middle-infrared range perpendicularly-incident into the incident surface so as to make the refracted rays enter obliquely the photo-current generating portion.

18. The method of manufacturing an infrared detector according to claim 12, wherein the quantum well structure of the photo-current generating portion is formed so that the electrons are excited by infrared rays in a wavelength range from 4 µm to 4.5 µm, which includes the 4.257-µm absorption wavelength of carbon dioxide.

\* \* \* \* \*